United States Patent
Yang et al.

(10) Patent No.: US 12,237,231 B2
(45) Date of Patent: Feb. 25, 2025

(54) FINFET DEVICE WITH WRAPPED-AROUND EPITAXIAL STRUCTURE AND MANUFACTURING METHOD THEREOF

(71) Applicant: Taiwan Semiconductor Manufacturing Co., Ltd., Hsin-Chu (TW)

(72) Inventors: Cheng-Yu Yang, Changhua County (TW); Chia-Ta Yu, Hsinchu (TW); Kai-Hsuan Lee, Hsinchu (TW); Sai-Hooi Yeong, Hsinchu County (TW); Feng-Cheng Yang, Hsinchu County (TW)

(73) Assignee: TAIWAN SEMICONDUCTOR MANUFACTURING COMPANY CO., LTD., Hsinchu (TW)

( * ) Notice: Subject to any disclaimer, the term of this patent is extended or adjusted under 35 U.S.C. 154(b) by 168 days.

(21) Appl. No.: 17/373,041

(22) Filed: Jul. 12, 2021

(65) Prior Publication Data

US 2021/0343599 A1    Nov. 4, 2021

Related U.S. Application Data

(60) Division of application No. 16/181,847, filed on Nov. 6, 2018, now Pat. No. 11,062,957, which is a
(Continued)

(51) Int. Cl.
*H01L 29/417* (2006.01)
*H01L 21/8238* (2006.01)
(Continued)

(52) U.S. Cl.
CPC ........ *H01L 21/823814* (2013.01); *H01L 21/823807* (2013.01); *H01L 21/823821* (2013.01);
(Continued)

(58) Field of Classification Search
None
See application file for complete search history.

(56) References Cited

U.S. PATENT DOCUMENTS 9,508,858 B2    11/2016  Diaz et al.
10,037,923 B1    7/2018  Lee et al.
(Continued)

FOREIGN PATENT DOCUMENTS

| CN | 102468235 B | 5/2014 |
| KR | 20140143841 A | 12/2014 |
| TW | 200629548 A | 8/2006 |

OTHER PUBLICATIONS

King, Tsu-Jse et al., "Advanced Materials and Processes for Nanometer-Scale FinFETs", University of California at Berkeley, Electrical Engineering and Computer Sciences Dept., Berkeley, California, 94720, http://nobent.kaist.ac.kr/paper/2002/Advanced%20Materials%20and%20Processes%20for%20Nanometer-scale%20FinFETs.pdf, published 2002, retrieved from the internet Aug. 28, 2017, 5 pages.

*Primary Examiner* — Benjamin P Sandvik
(74) *Attorney, Agent, or Firm* — HAYNES AND BOONE, LLP

(57) ABSTRACT

A semiconductor device includes a substrate and two fins protruding from the substrate. Each fin includes two source/drain (S/D) regions and a channel region. Each fin includes a top surface that remains flat across the S/D regions and the channel region. The semiconductor device also includes a gate stack engaging each fin at the respective channel region, a first dielectric layer on sidewalls of the gate stack, a first epitaxial layer over top and sidewall surfaces of the S/D regions of the two fins, and a second epitaxial layer over top and sidewall surfaces of the first epitaxial layer.

20 Claims, 20 Drawing Sheets

Related U.S. Application Data continuation of application No. 15/688,274, filed on Aug. 28, 2017, now Pat. No. 10,141,231.

(51) Int. Cl.
*H01L 27/092* (2006.01)
*H01L 29/66* (2006.01)
*H01L 29/78* (2006.01)

(52) U.S. Cl.
CPC .... *H01L 27/0924* (2013.01); *H01L 29/41791* (2013.01); *H01L 29/66795* (2013.01); *H01L 29/785* (2013.01)

(56) References Cited

U.S. PATENT DOCUMENTS

| | | |
|---|---|---|
| 10,170,367 B2 | 1/2019 | Lin et al. |
| 2004/0038517 A1 | 2/2004 | Kang et al. |
| 2006/0086977 A1 | 4/2006 | Shah et al. |
| 2012/0104472 A1 | 5/2012 | Xu et al. |
| 2013/0005127 A1 | 1/2013 | Yin et al. |
| 2013/0105916 A1 | 5/2013 | Chang et al. |
| 2013/0161729 A1 | 6/2013 | Xie |
| 2013/0277769 A1 | 10/2013 | Tung et al. |
| 2015/0170916 A1* | 6/2015 | Yu .................... H01L 21/02639 438/493 |
| 2015/0179645 A1* | 6/2015 | Liao .................... H01L 29/7851 257/77 |
| 2016/0079367 A1* | 3/2016 | Yoo .................... H01L 27/1211 257/190 |
| 2016/0104787 A1* | 4/2016 | Kittl .................. H01L 29/41791 438/283 |
| 2016/0141423 A1* | 5/2016 | Diaz .................... H01L 23/5226 438/653 |
| 2016/0149036 A1 | 5/2016 | Huang et al. |
| 2016/0240419 A1 | 8/2016 | Sieber et al. |
| 2017/0140996 A1 | 5/2017 | Lin et al. |
| 2017/0148797 A1* | 5/2017 | Kim ...................... H01L 29/456 |
| 2017/0186748 A1 | 6/2017 | Lee et al. |
| 2017/0243791 A1 | 8/2017 | Jacob |
| 2017/0243944 A1 | 8/2017 | Li et al. |
| 2017/0256456 A1 | 9/2017 | Lee et al. |
| 2017/0358664 A1 | 12/2017 | Cheng et al. |
| 2017/0365682 A1 | 12/2017 | Pranatharthiharan et al. |
| 2018/0219080 A1 | 8/2018 | Clendenning |
| 2018/0315840 A1 | 11/2018 | Chui et al. |
| 2018/0337040 A1 | 11/2018 | Kao et al. |

\* cited by examiner

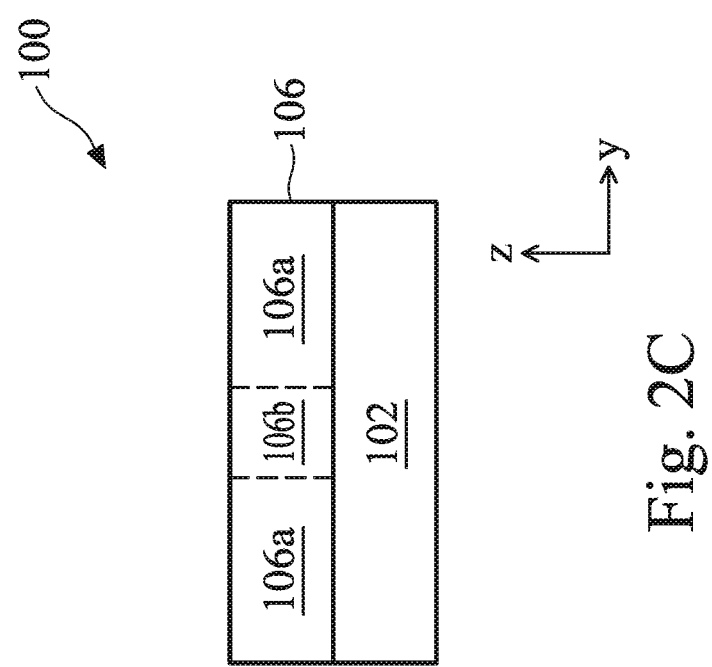
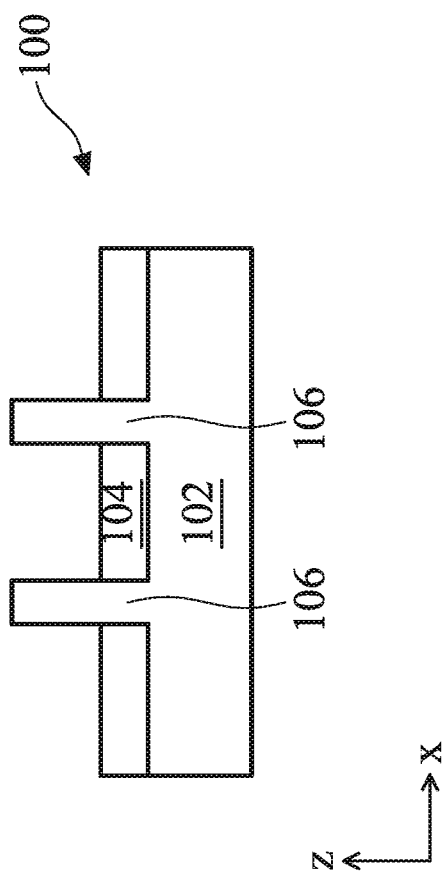
Fig. 2B
Fig. 2C

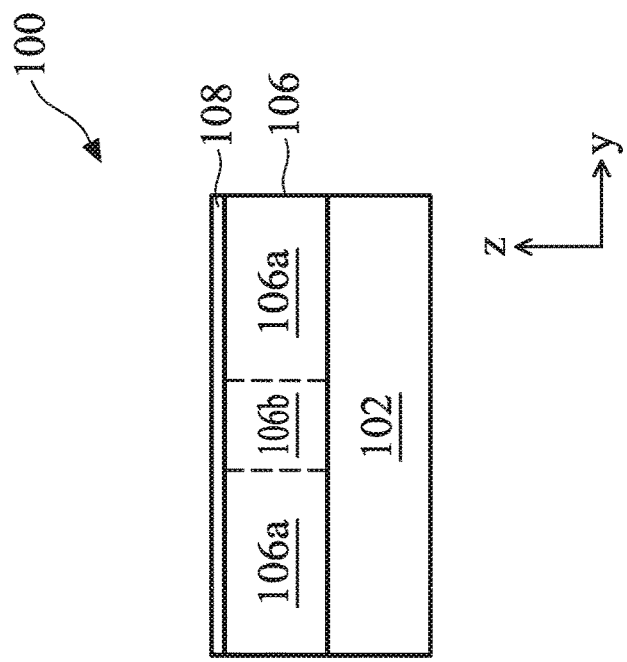
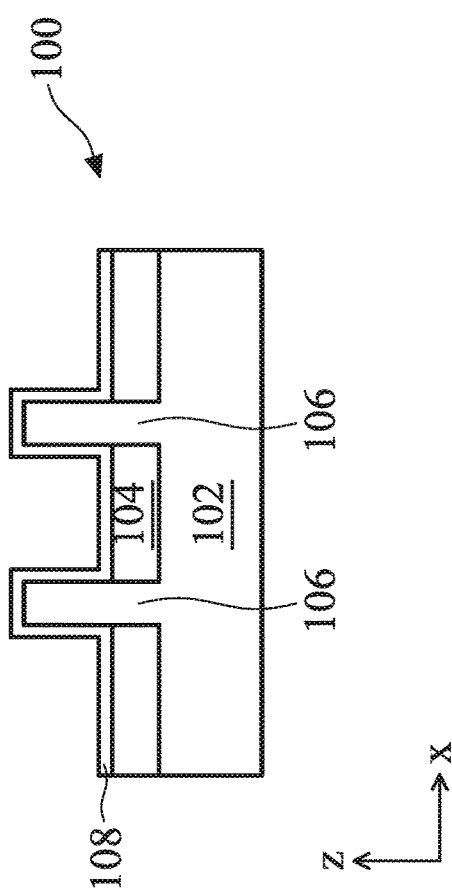
Fig. 3A
Fig. 3B

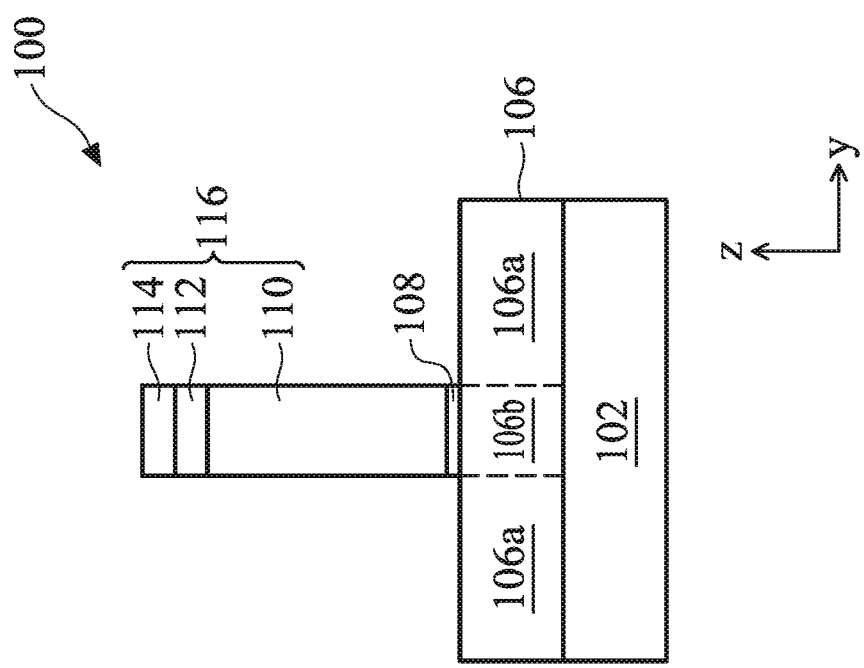
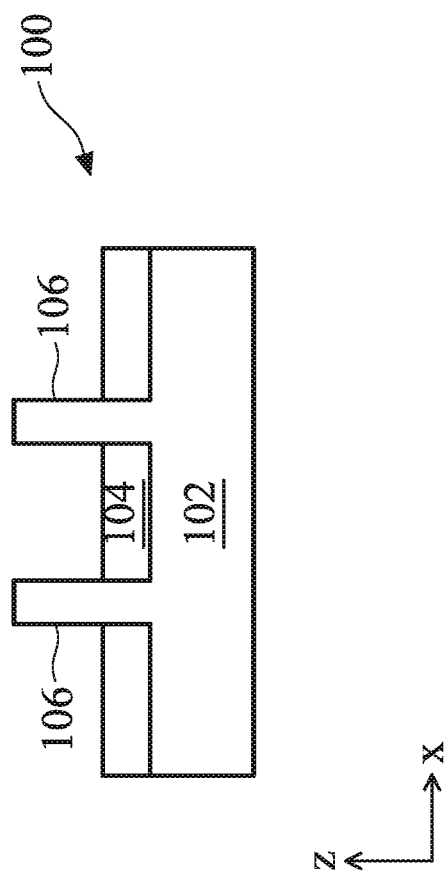
Fig. 4B
Fig. 4C

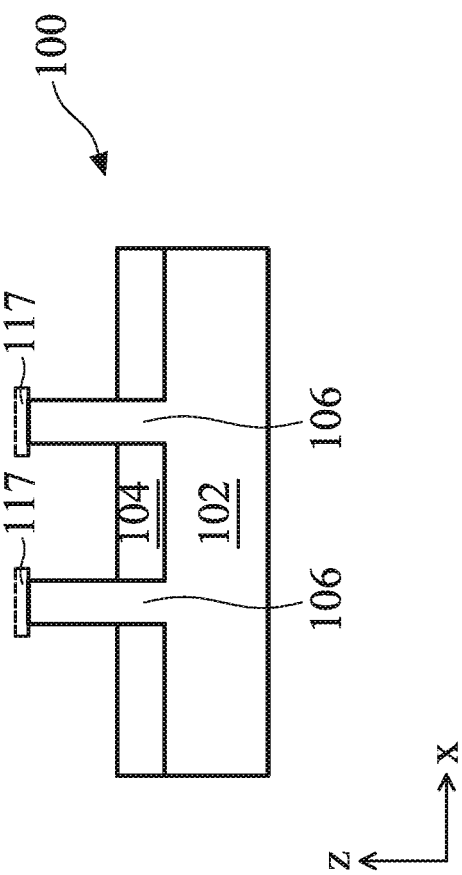
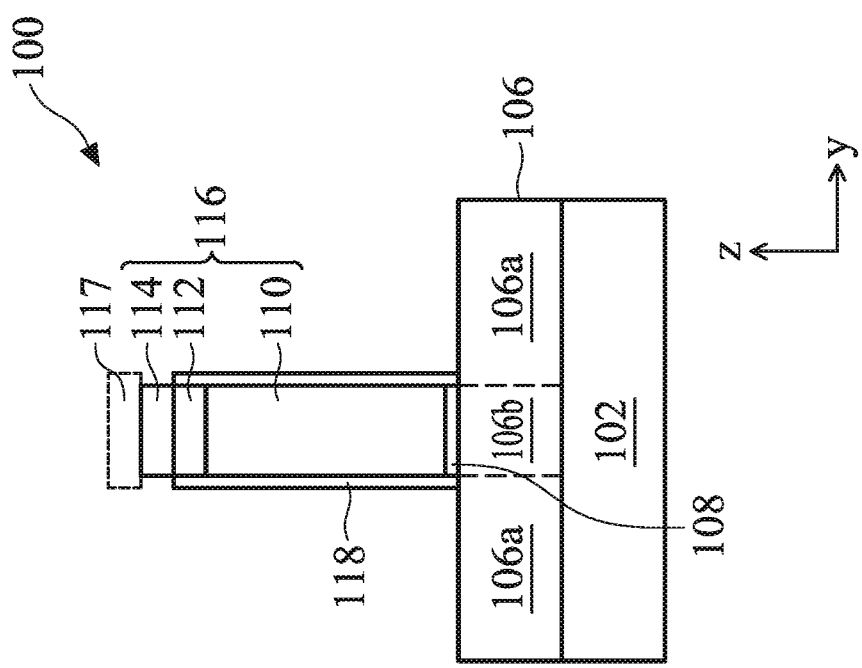
Fig. 6A
Fig. 6B

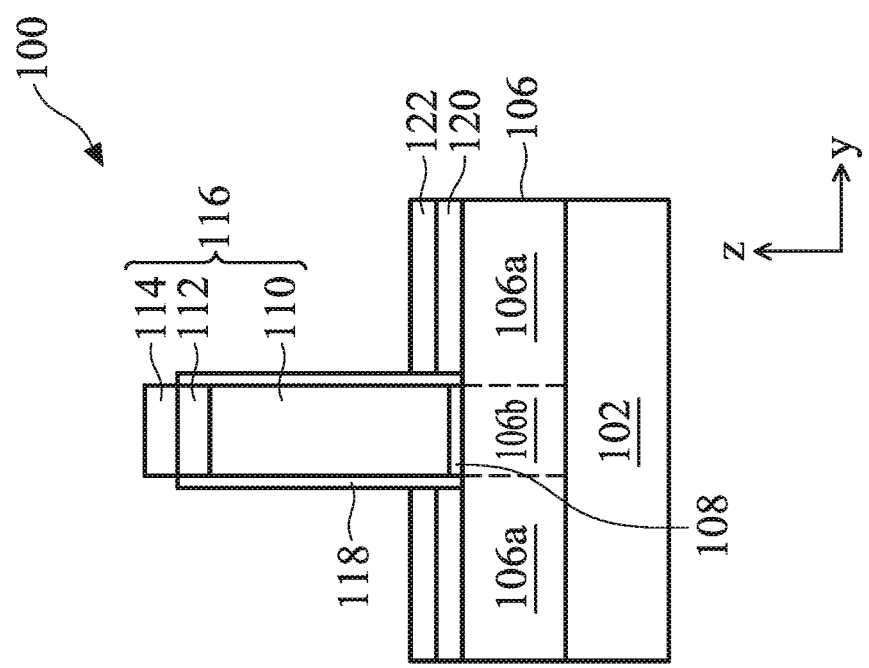
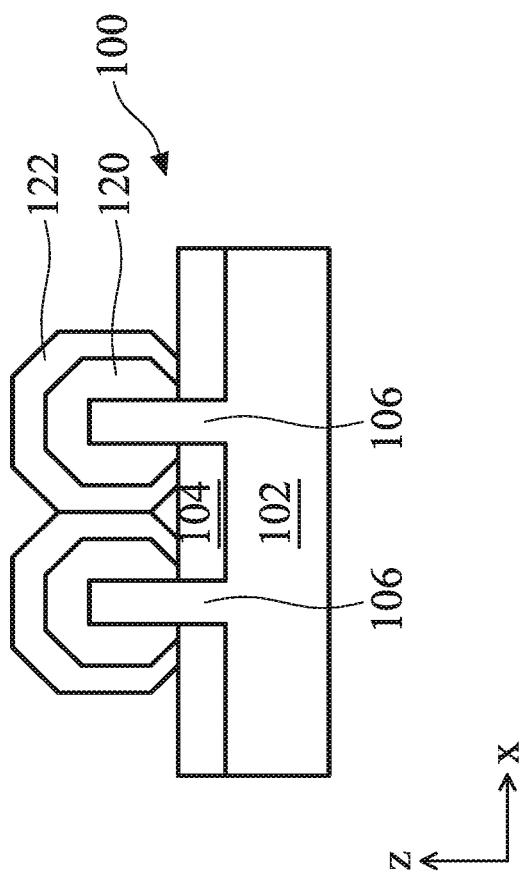
Fig. 7A
Fig. 7B

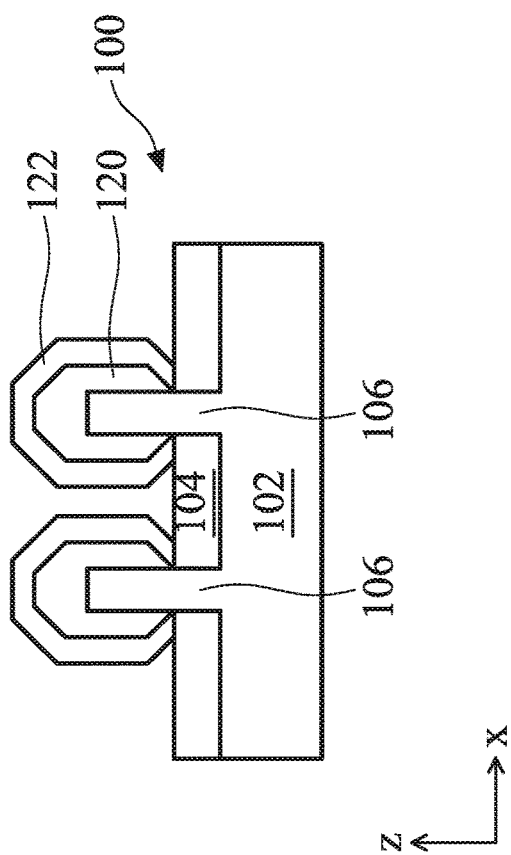
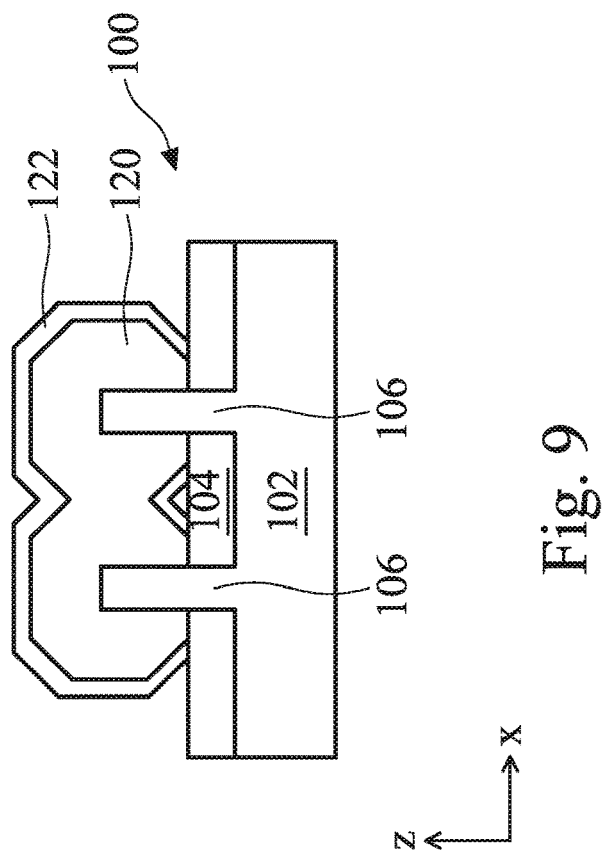
Fig. 8
Fig. 9

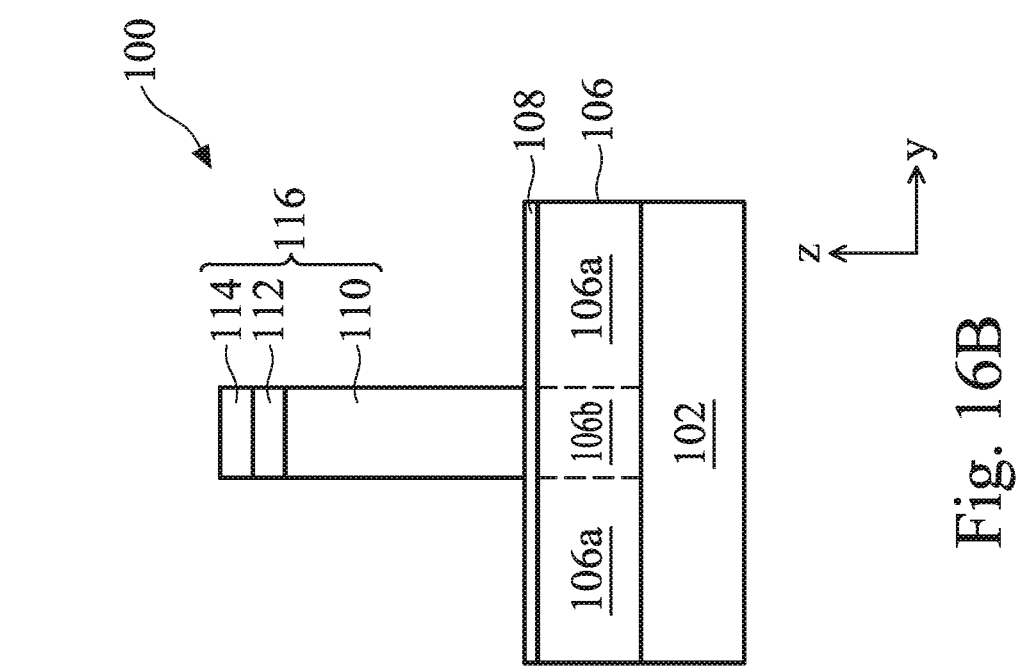
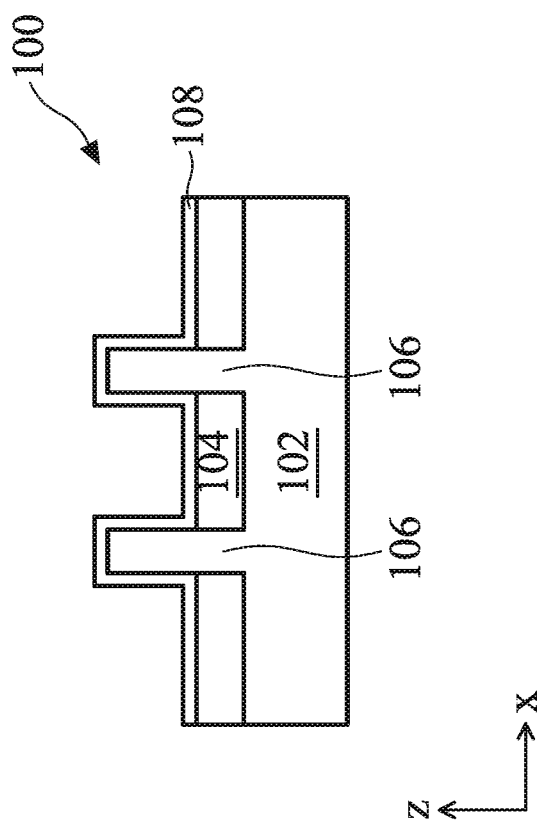
Fig. 16A
Fig. 16B

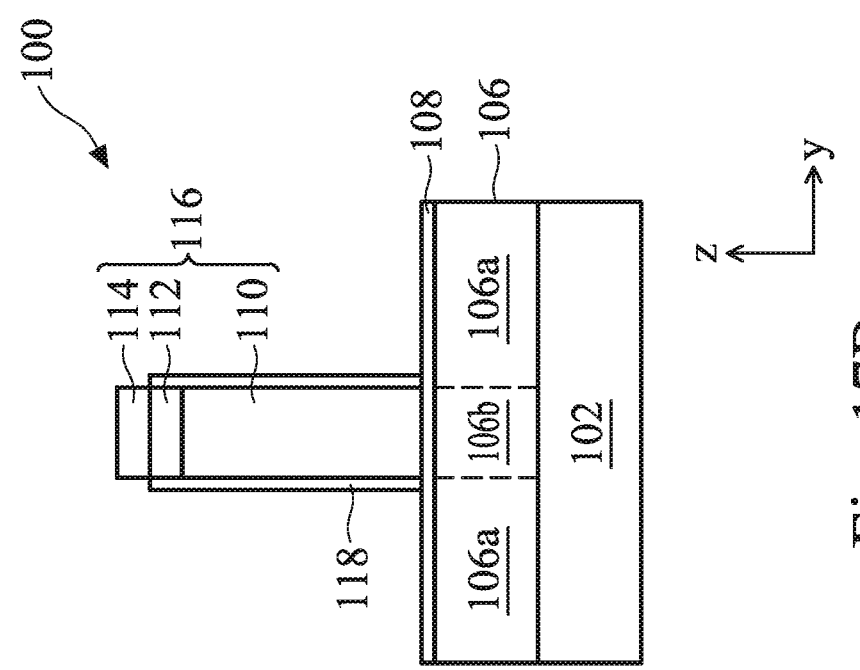
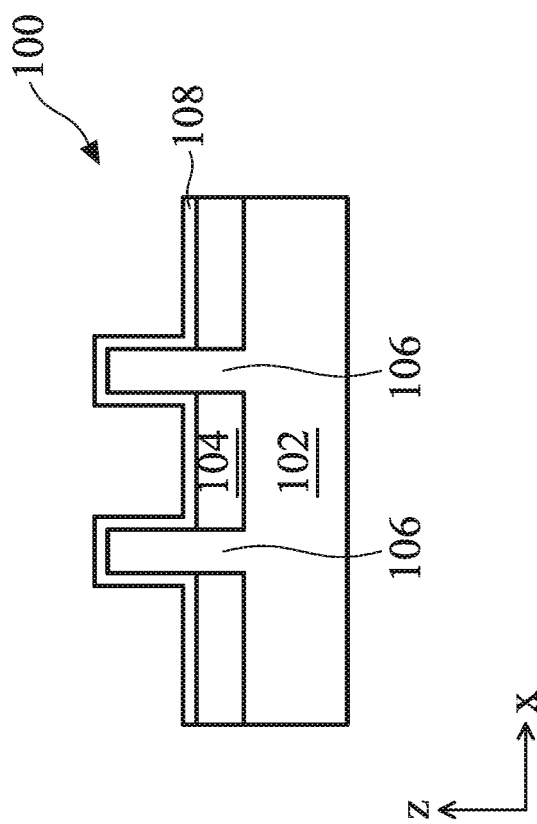
Fig. 17A
Fig. 17B

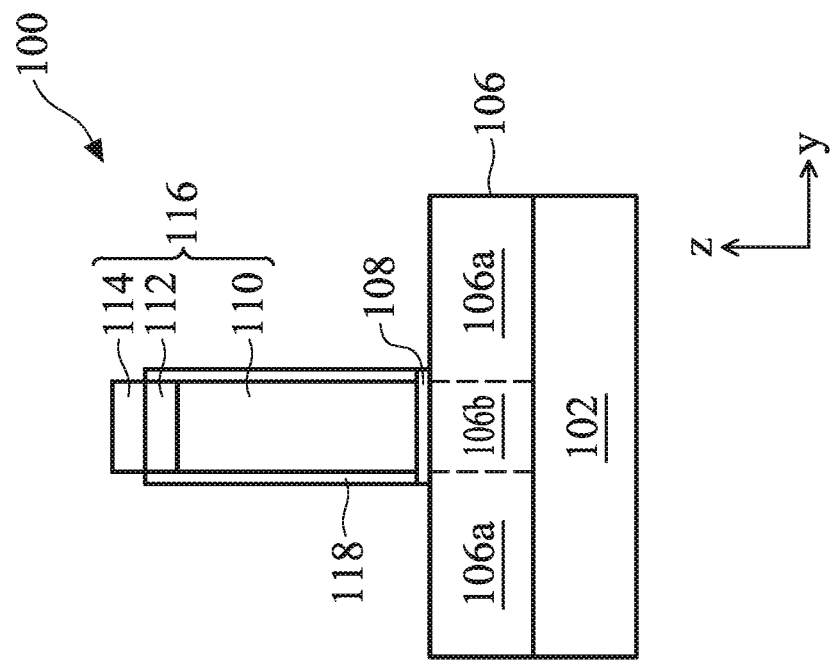
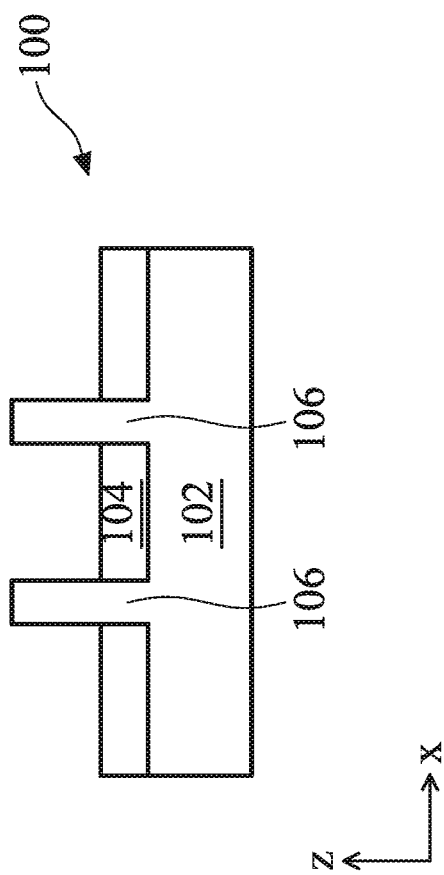
Fig. 18A
Fig. 18B

FINFET DEVICE WITH WRAPPED-AROUND EPITAXIAL STRUCTURE AND MANUFACTURING METHOD THEREOF

PRIORITY

This is a divisional application of U.S. patent application Ser. No. 16/181,847, filed Nov. 6, 2018, which is a continuation of U.S. patent application Ser. No. 15/688,274, filed Aug. 28, 2017, and issued as U.S. Pat. No. 10,141,231, the entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in FINFET fabrication processes, it is typical to recess the fins in their source/drain (S/D) regions and to epitaxially grow some semiconductor materials over the recessed fins as S/D features. Such a method sometimes introduces the following problems. First, the recess of the fins may introduce variations in the recess profile due to etch loading effects among other factors. The variations in the recess profile sometimes lead to variations in the epitaxial S/D features. Second, the recess of the fins may sometimes lead to the relaxation of the strains built into the channel region of the fins. Accordingly, improvements in the FINFET S/D engineering are desirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2B, 3A, 4B, 5A, 6A, 7A, 8, 9, 10A, 11A, 12, 13, and 14 are cross-sectional views of a portion of the semiconductor device in FIGS. 2A and 4A, along the "A-A" line of FIGS. 2A and 4A, in accordance with some embodiments, in intermediate stages of fabrication according to an embodiment of the method in FIG. 1.

FIGS. 2C, 3B, 4C, 5B, 6B, 7B, 10B, and 11B are cross-sectional views of a portion of the semiconductor device in FIGS. 2A and 4A, along the "B-B" line of FIGS. 2A and 4A, in accordance with some embodiments, in intermediate stages of fabrication according to an embodiment of the method in FIG. 1.

FIGS. 16A, 17A, 18A, 19A, and 20A are cross-sectional views of a portion of the semiconductor device in FIG. 2A, along the "A-A" line of FIG. 2A, in accordance with some embodiments, in intermediate stages of fabrication according to an embodiment of the method in FIG. 15.

FIGS. 16B, 17B, 18B, 19B, and 20B are cross-sectional views of a portion of the semiconductor device in FIG. 2A, along the "B-B" line of FIG. 2A, in accordance with some embodiments, in intermediate stages of fabrication according to an embodiment of the method in FIG. 15.

DETAILED DESCRIPTION

Figure 1:
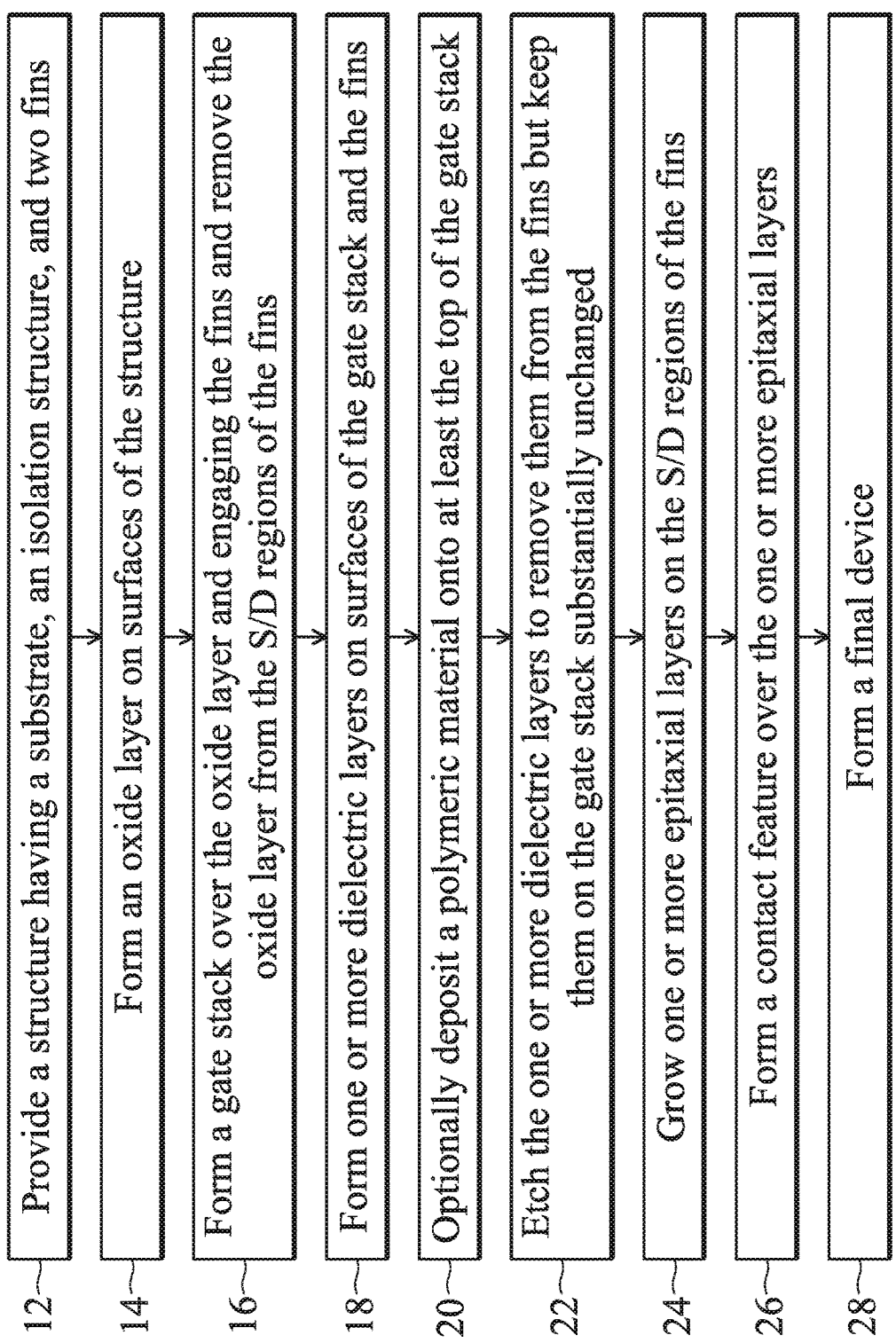
FIG. 1 is a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to FINFET source/drain (S/D) engineering. According to some aspects of the present disclosure, the S/D regions of the fins are not recessed, and epitaxial features are grown on surfaces of the S/D regions of the fins. This provides the benefits of keeping the strains in the channel regions of the fins intact and providing large epitaxial features for easy contact landing. The provided subject matter describes various innovative ways of keeping the S/D regions of the fins substantially intact during the process of gate formation (including gate spacer formation) and S/D engineering.

Figure 2A:
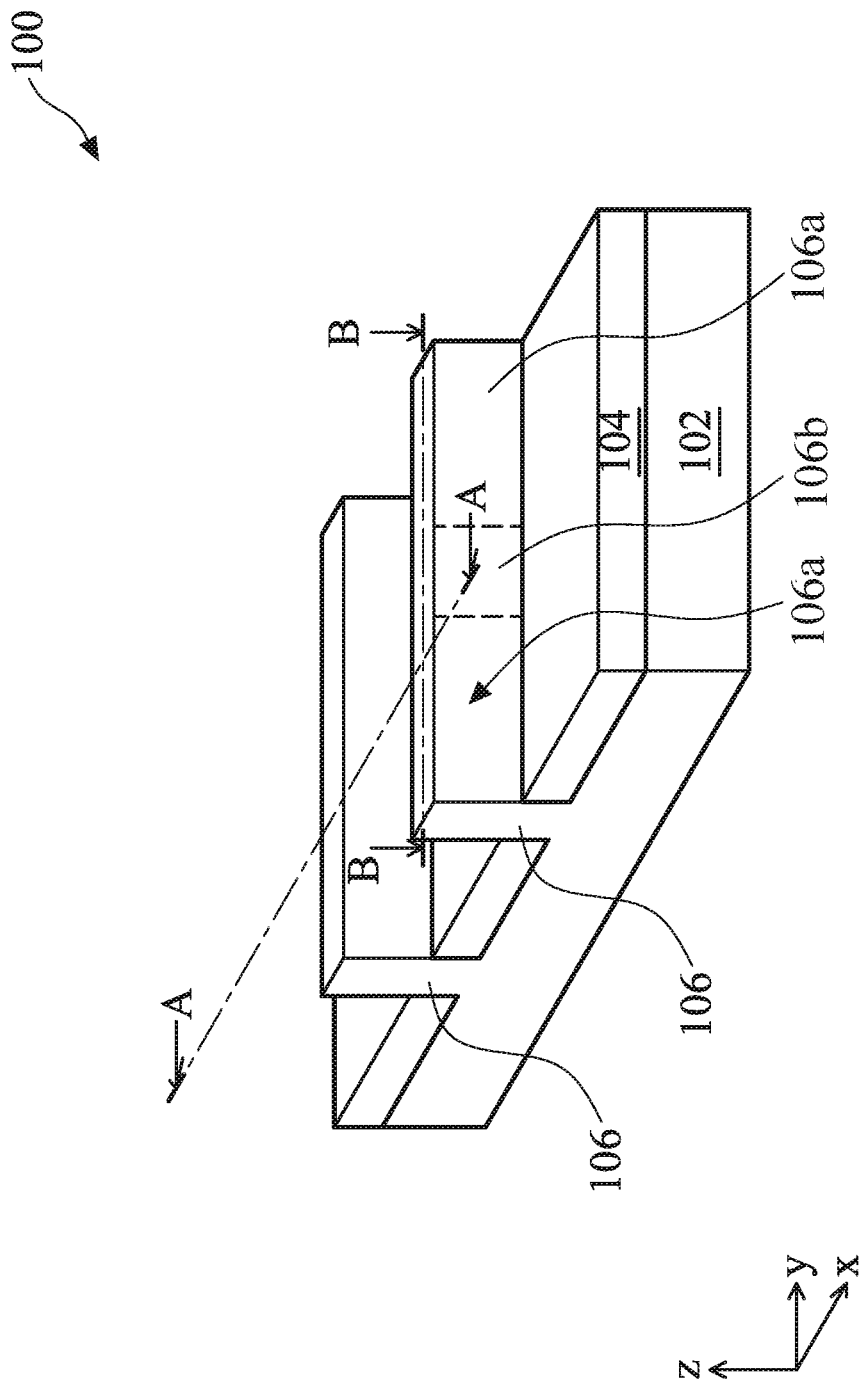
FIGS. 2A and 4A are perspective views of a portion of a semiconductor device in intermediate stages of fabrication according to some embodiments.
Figure 4A:
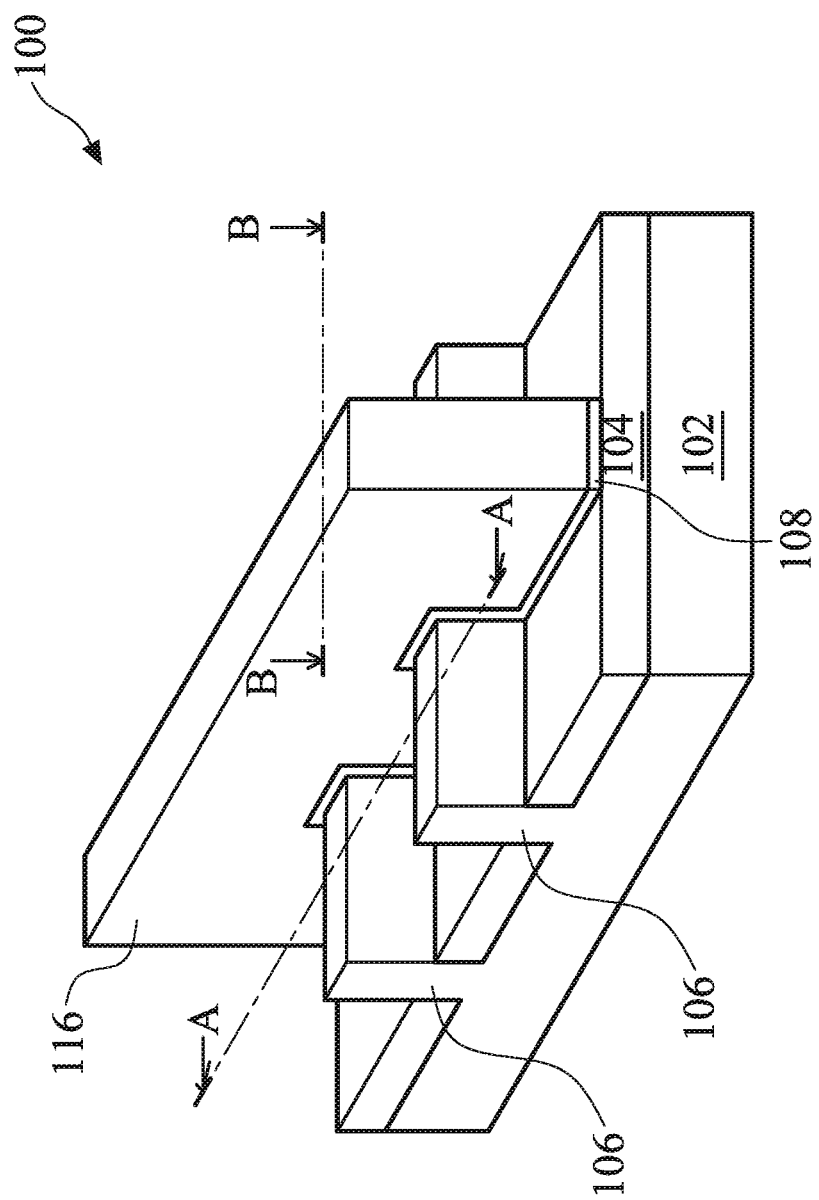

FIG. 1 shows a flow chart of a method 10 of forming a semiconductor device 100, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-14. FIGS. 2A and 4A are perspective views of a portion of the semiconductor device 100 in intermediate stages of fabrication. FIGS. 2B, 3A, 4B, 5A, 6A, 7A, 8, 9, 10A, 11A, 12, 13, and 14 are cross-sectional views of a portion of the semiconductor device in FIGS. 2A and 4A, along the "A-A" line of FIGS. 2A and 4A, in accordance with some embodiments. FIGS. 2C, 3B, 4C, 5B, 6B, 7B, 10B, and 11B are cross-sectional views of a portion of the semiconductor device in FIGS. 2A and 4A, along the "B-B" line of FIGS. 2A and 4A, in accordance with some embodiments.

The semiconductor device (or structure or device structure) 100 is provided for illustration purposes and does not necessarily limit the embodiments of the present disclosure to any number of devices, any number of regions, or any configuration of structures or regions. Furthermore, the semiconductor device 100 as shown in FIGS. 2-14 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FINFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 1, at operation 12, the method 10 (FIG. 1) provides (or is provided with) a semiconductor device 100. FIG. 2A shows a perspective view of the device 100. FIGS. 2B and 2C show cross-sectional views of the device 100 along the "A-A" and "B-B" lines in FIG. 2A respectively. Referring to FIGS. 2A, 2B, and 2C collectively, the device 100 includes a substrate 102, an isolation structure 104 over the substrate 102, and two fins 106 extending from the substrate 102 and through the isolation structure 104.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer. In embodiments, the substrate 102 includes active regions such as p-wells and n-wells for forming active devices.

The isolation structure 104 may comprise silicon oxide, silicon nitride, silicon oxynitride, fluoride-doped silicate glass (FSG), a low-k dielectric material, and/or other suitable insulating material. The isolation structure 104 may be shallow trench isolation (STI) features in some embodiments. The fins 106 may comprise substantially the same semiconductor material as the substrate 102. Each of the fins 106 includes a channel region 106b and two S/D regions 106a sandwiching the channel region 106b.

The fins 106 may be fabricated using suitable processes including photolithography and etching processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 106 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The fins 106 may also be formed using double-patterning lithography (DPL) processes. Numerous other embodiments of methods to form the fins 106 may be suitable.

The isolation structure 104 may be formed by etching trenches in the substrate 102, e.g., as part of the fins 106 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 104 may include a multi-layer structure, for example, having one or more thermal oxide liner layers.

At operation 14, the method 10 (FIG. 1) forms an oxide layer 108 on surfaces of the device 100. Referring to FIGS. 3A and 3B, in the present embodiment, the oxide layer 108 is formed over top and sidewall surfaces of the fins 106 and over the top surface of the isolation structure 104. In an alternative embodiment, the oxide layer 108 is formed on the top and sidewall surfaces of the fins 106 but not on the top surface of the isolation structure 104. The oxide layer 108 may be formed by various methods such as chemical oxidation of silicon, thermal oxidation of silicon, ozone oxidation of silicon, atomic layer deposition (ALD), chemical vapor deposition (CVD), physical vapor deposition (PVD), or other suitable methods. The oxide layer 108 may comprise silicon oxide or a high-k oxide (having a dielectric constant greater than that of silicon oxide) such as Hf oxide, Ta oxide, Ti oxide, Zr oxide, Al oxide or a combination thereof. The oxide layer 108 may be formed to have a thickness of few angstroms to few tens of angstroms.

At operation 16, the method 10 (FIG. 1) forms a gate stack 116. Referring to FIGS. 4A, 4B, and 4C, the gate stack 116 is disposed over the isolation structure 104 and the fins 106. Particularly, the gate stack 116 engages the fins 106 in the respective channel regions 106b. The gate stack 116 includes a gate electrode layer 110, a first hard mask (HM) layer 112, and a second HM layer 114. In the present embodiment, the gate electrode layer 110 may comprise polysilicon and is to be replaced by a metal gate in a gate replacement process. The HM layers 112 and 114 may each comprise an oxide or a nitride, such as silicon nitride, silicon oxide, silicon oxynitride (SiON), or silicon oxycarbon nitride (SiOCN). In an embodiment, the operation 16 includes various deposition and etching processes. For example, the operation 16 may deposit the layer 110 as a blanket layer over the oxide 108, and deposit the layers 112 and 114 over the layer 110 sequentially. Thereafter, a photolithography process is performed to form an etch mask based on a gate layout definition, and the layers 114, 112, and 110 are etched with the etch mask (or a derivative thereof) to form the gate stack 116. In the present embodiment, the oxide layer 108 is also etched with the etch mask (or a derivative thereof). As a result, the oxide layer 108 is removed from the fins 106 except under the gate stack 116. Particularly, the oxide layer 108 is removed from the S/D regions 106a of the fins 106.

Figure 5B:
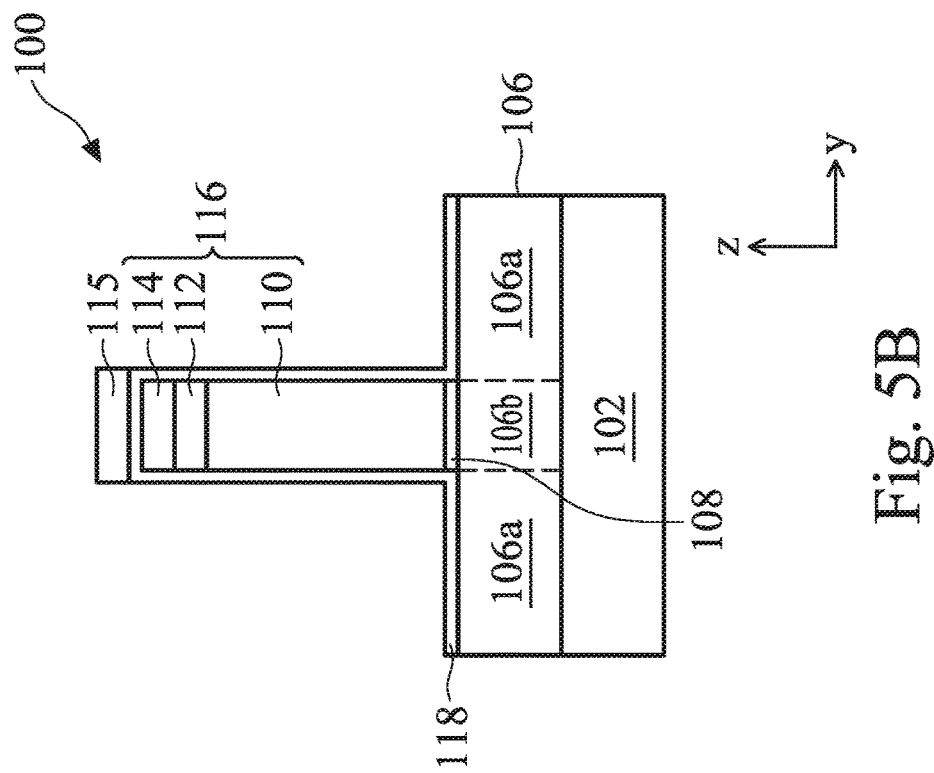
Figure 5A:
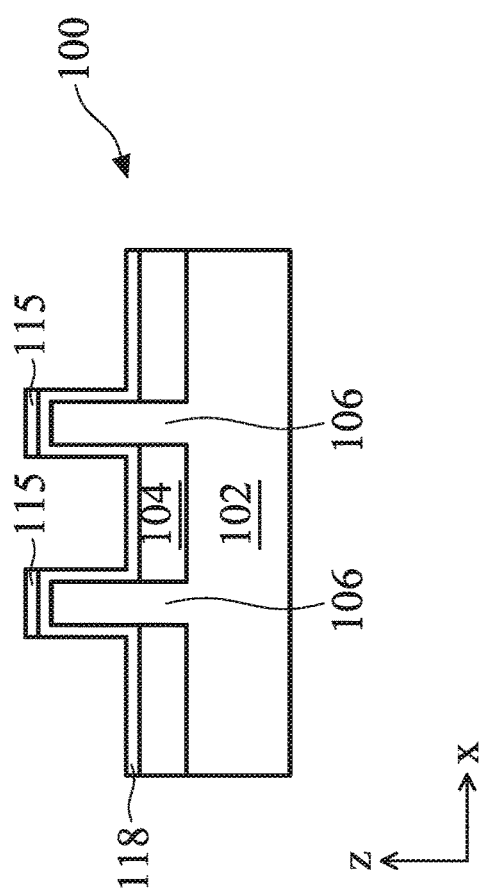

At operation 18, the method 10 (FIG. 1) forms a spacer layer 118 on the surfaces of the device 100. The spacer layer 118 may include one or more dielectric layers. Referring to FIGS. 5A and 5B, the spacer layer 118 is formed on the top and sidewall surfaces of the gate stack 116, on the top and sidewall surfaces of the fins 106, and on the top surface of the isolation structure 104. The spacer layer 118 may include one or more dielectric materials such as silicon nitride, silicon oxide, silicon carbide, silicon oxynitride (SiON), silicon oxycarbide (SiOC), silicon oxycarbon nitride (SiOCN), other materials, or a combination thereof. The spacer layer 118 may be formed by one or more methods including chemical oxidation, thermal oxidation, ALD, CVD, and/or other suitable methods. In embodiments, the operation 18 may further include forming lightly doped S/D (LDD) features in the S/D regions 106a of the fins 106.

At operation 20, the method 10 (FIG. 1) deposits a polymeric material 115 over at least the top of the gate stack 116 (FIGS. 5A and 5B). In an embodiment, the polymeric material 115 may comprise $C_wH_xF_yO_z$ polymer where w, x, y, and z indicate the atomic percentage of each chemical element. For example, the polymeric material 115 may be deposited under a process condition having a gas mixture of $CH_3F$ and oxygen at a flow rate of 100 to 300 sccm (standard cubic centimeters per minute), a source power of 1000 to 2000 W, and a pressure of 5 to 40 mTorr. It is noted that the polymeric material 115 is deposited unevenly across the surfaces of the device 100 due to the uneven topography of the structures. Particularly, the top surface of the gate stack 116 is much higher than the top surface of the fins 106. As a result, the polymeric material 115 is deposited much thicker on the top of the gate stack 116 than on the top of the fins 106. This provides the benefits of protecting the spacer layer 118 on the sidewall surfaces of the gate stack 116 from a subsequent etching process (to be described) that removes the spacer layer 118 on the surfaces of the S/D regions of the fins 106. In an embodiment of the method 10, the operation 20 is optional and may be bypassed. To further this embodiment, the method 10 may proceed from the operation 18 to operation 22 (to be described) and relies on a special simultaneous etching and deposition scheme of the operation 22 to protect the spacer layer 118 on the sidewall surfaces of the gate stack 116.

At operation 22, the method 10 (FIG. 1) performs an etching process to the device 100. Particularly, the etching process is tuned to selectively remove the material(s) of the spacer layer 118 but not the fins 106. In an embodiment where the spacer layer 118 comprises an oxide and/or a nitride and the fins 106 comprise silicon, the etching process is tuned to selectively etch the oxide and/or the nitride, but not (or insignificantly) silicon. It is noted that the isolation structure 104 may be designed to have different dielectric material(s) than the spacer layer 118, even if they both comprise some oxides, to avoid damages to the isolation structure 104. It is also noted that some loss of the isolation structure 104 may be acceptable in some embodiments.

In an embodiment, the etching process is anisotropic and may be performed with a gas mixture of $CH_3F$ and oxygen at a flow rate of 100 to 300 sccm, a source power of 1000 to 2000 W, and a pressure of 5 to 40 mTorr. Other gases may be alternatively or additionally deployed by the etching process. Particularly, the etching process produces one or more polymeric byproducts 117 (FIGS. 6A-6B) such as $C_wH_xF_yO_z$ polymer where w, x, y, and z indicate the atomic percentage of each chemical element. The polymeric byproducts 117 are produced simultaneously during the etching process and are deposited over the various surfaces of the device 100. Because the gate stack 116 is much taller than the fins 106, the top of the gate stack 116 receives a much larger deposit of the polymeric byproducts 117 than the top of the fins 106 does. As a result, the portion of the spacer layer 118 on the sidewalls of the gate stack 116 and the remnant oxide layer 108 remains substantially unchanged during the etching process, while the portion of the spacer layer 118 on the surfaces of the S/D regions of the fins 106 is removed. Referring to FIGS. 6A and 6B, the spacer layer 118 is removed from the top of the gate stack 116, from the top and sidewall surfaces of the fins 106 in the S/D regions 106a, and from the top surface of the isolation structure 104. But, a majority of the portion of the spacer layer 118 on the sidewalls of the gate stack 116 and the remnant oxide layer 108 remains. In some embodiment, some remnant spacer layer 118 may remain at the top surface of the isolation structure 104 without affecting the performance of the device 100. The operation 22 may perform additional processes, such as a cleaning process, to prepare the fins 106 for subsequent epitaxial growth thereon. Since the fins 106 are not etched, the operation 22 does not relax any strains built into the channel region 106b. The polymeric byproducts 117 are removed from the top of device 100 at the end of the operation 22. If the polymeric material 115 has been deposited by the operation 20, it is removed by the operation 22 as well.

At operation 24, the method 10 (FIG. 1) grows one or more epitaxial layers on the S/D regions 106a of the fins 106. Referring to FIGS. 7A and 7B, in the present embodiment, the one or more epitaxial layers include a first epitaxial layer 120 and a second epitaxial layer 122. Particularly, the first epitaxial layer 120 is deposited on the top and sidewall surfaces of the S/D regions of the fins 106. In other words, the first epitaxial layer 120 wraps around the S/D regions of the fins 106. Further, the second epitaxial layer 122 wraps around the first epitaxial layer 120. In the embodiment shown in FIG. 7a, the first epitaxial layers 120 on the two fins 106 do not merge, but the second epitaxial layers 122 on the two fins 106 laterally merge (i.e., touch each other). Depending on the lateral distance (along the "x" direction) between the two fins 106 and the control of the epitaxial growth, the first and second epitaxial layers, 120 and 122, may be formed to have different merging profiles. One example is shown in FIG. 8, where neither the first epitaxial layer 120 nor the second epitaxial layer 122 merge with adjacent corresponding epitaxial feature. Another example is shown in FIG. 9, where the first epitaxial layers 120 on the two fins 106 laterally merge and the second epitaxial layers 122 on the two fins 106 also laterally merge. To form the structure as shown in FIG. 9, the operation 24 waits until the first epitaxial layers 120 laterally merge before growing the second epitaxial layer 122.

In various embodiments, the first and second epitaxial layers, 120 and 122, may comprise same or different semiconductor materials such as silicon, germanium, silicon germanium, one or more III-V materials, a compound semiconductor, or an alloy semiconductor. In one embodiment, the fins 106 comprise silicon, and the epitaxial layers 120 and 122 comprise silicon germanium. The epitaxial growth process may be a LPCVD process with a silicon-based precursor, a selective epitaxial growth (SEG) process, or a cyclic deposition and etching (CDE) process. For example, silicon crystal may be grown with LPCVD with dichlorosilane ($SiH_2Cl_2$) as the precursor. For another example, silicon germanium crystal may be formed with a CDE process using HCl as the etching gas and a gas mixture of GeH$_4$ and H$_2$ as the deposition gas which contains about 1% to about 10% GeH$_4$ in H$_2$. Furthermore, the epitaxial layers 120 and 122 may be doped in-situ (during the epitaxial growth process) or ex-situ (after the epitaxial growth process is completed) with one or more p-type dopants, such as boron or indium, or one or more n-type dopants, such as phosphorus or arsenic.

Still further, the operation 24 may form silicidation or germano-silicidation on the surfaces of the epitaxial layer 122. For example, silicidation, such as nickel silicide or titanium silicide, may be formed by depositing a metal layer over the epitaxial feature 122, annealing the metal layer such that the metal layer reacts with silicon in the epitaxial features 122 to form the metal silicidation, and thereafter removing the non-reacted metal layer. In an alternative embodiment, the operation 24 does not form the silicidation and the method 10 forms the silicidation after etching contact holes, as described below.

At operation 26, the method 10 (FIG. 1) forms one or more contact features on the epitaxial layer 122. The operation 26 may include a variety of processes, such as forming a dielectric layer (e.g., an inter-layer dielectric (ILD) layer) over the epitaxial layer 122 and the gate stack 116, etching contact holes through the dielectric layer to expose the epitaxial layer 122, and depositing one or more conductive layers in the contact holes to form the contact features. These processes are further described below.

Figure 10B:
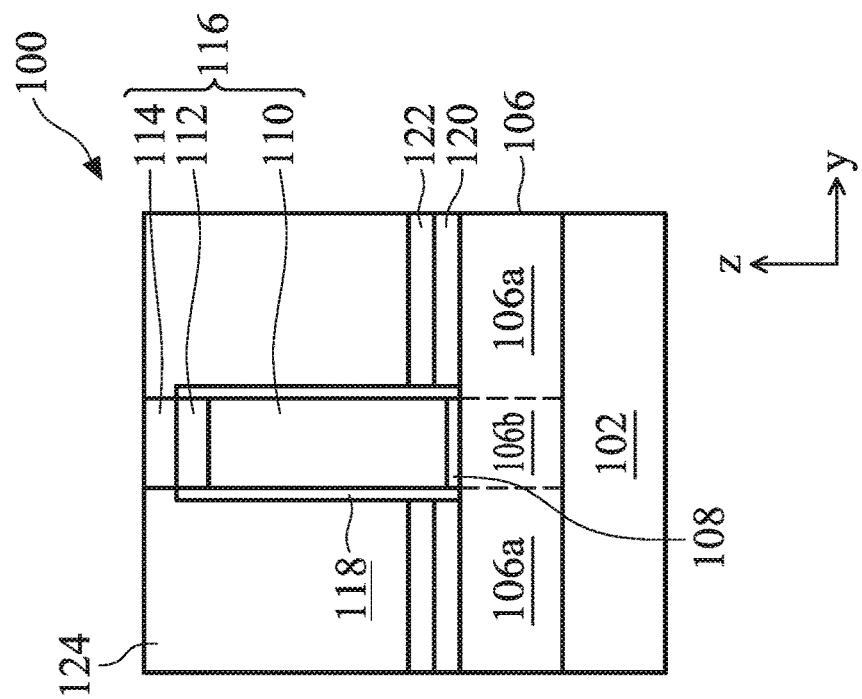
Figure 10A:
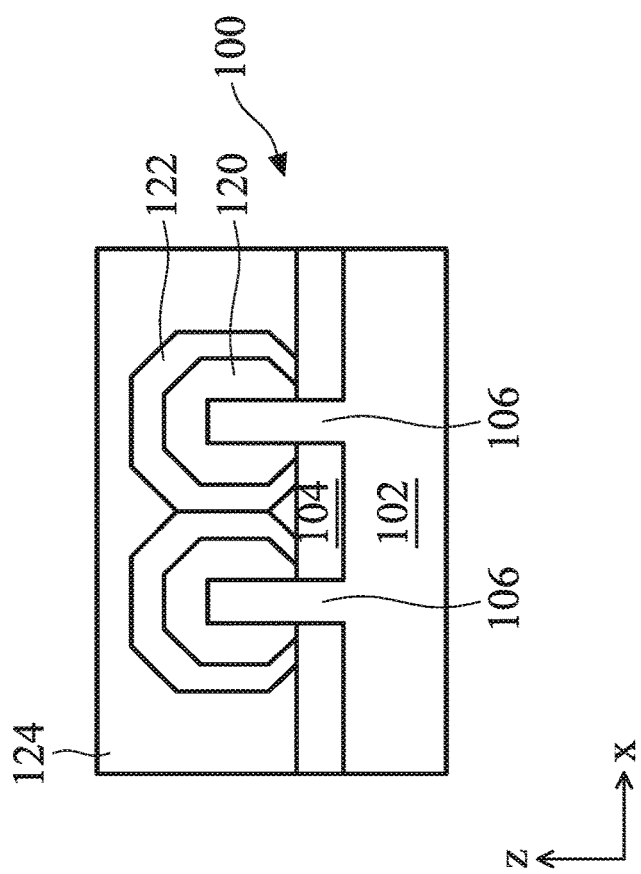

Referring to FIGS. 10A and 10B, a dielectric layer 124 is deposited to cover the epitaxial layers 120 and 122 as well as the gate stack 116 and the spacer layer 118. The dielectric layer 124 may include materials such as tetraethylorthosilicate (TEOS) oxide, doped or un-doped silicate glass, fused silica glass (FSG), and/or other suitable dielectric materials. The dielectric layer 124 may be deposited by a PECVD process, flowable CVD (FCVD), or other suitable deposition technique. After the dielectric layer 124 is deposited, the operation 26 may perform a chemical mechanical planarization (CMP) process to planarize the top surface of the dielectric layer 124 and to expose the HM layer 114. In some embodiment, a contact etch stop layer (not shown) having a dielectric material such as silicon nitride is deposited underneath the dielectric layer 124.

Figure 11B:
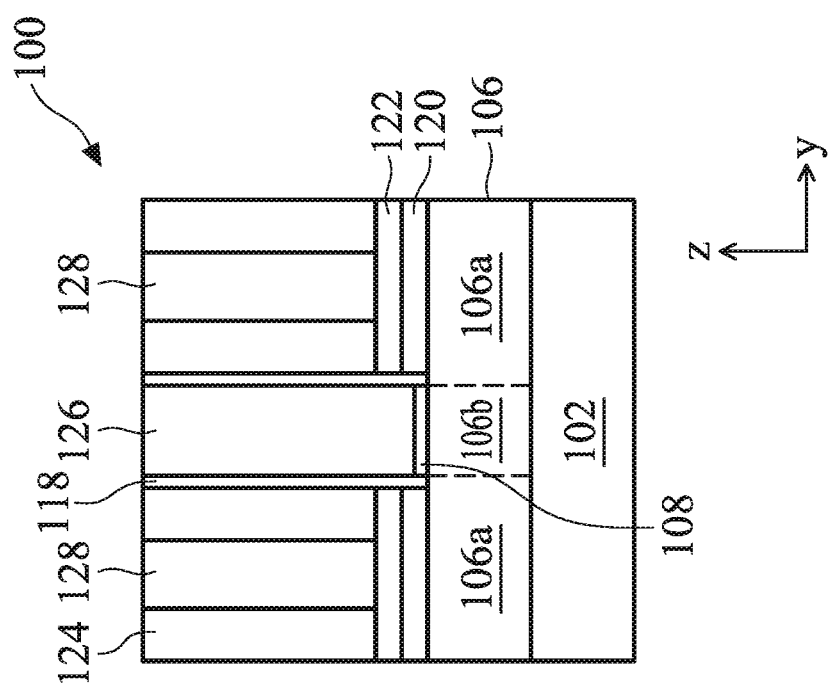
Figure 11A:
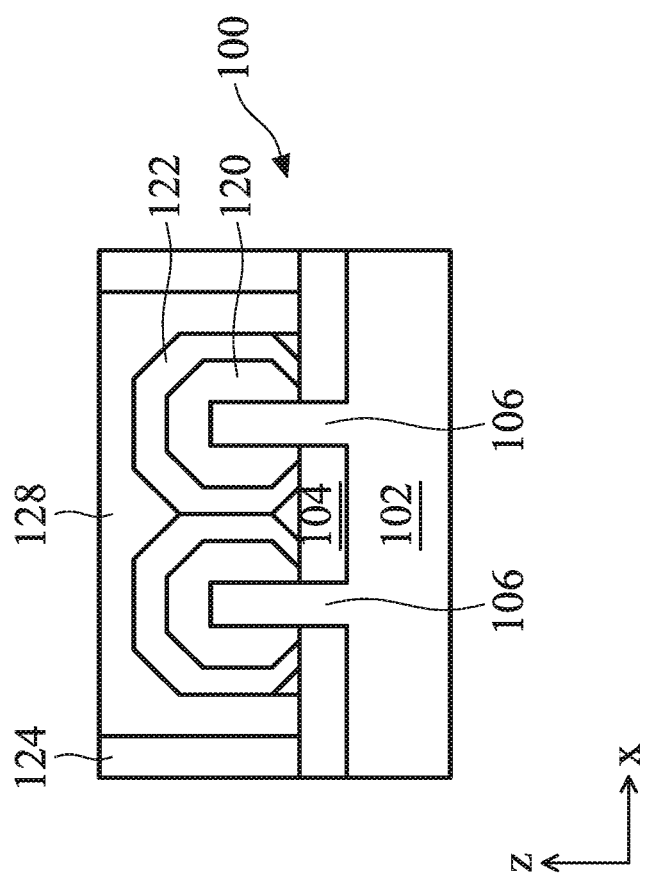

Referring to FIGS. 11A and 11B, the operation 26 etches contact holes into the dielectric layer 124 to expose the epitaxial layer 122 and subsequently deposits one or more conductive layers into the contact holes to form the S/D contact features 128. The S/D contact features 128 may include a barrier layer and a metal fill layer over the barrier layer. The barrier layer may include a conductive nitride such as TaN or TiN, and the metal fill layer may include aluminum (Al), tungsten (W), copper (Cu), cobalt (Co), combinations thereof, or other suitable material. Each of the barrier layer and the metal fill layer may be formed by PVD, CVD, plating, or other suitable methods. In an embodiment, a silicidation or germano-silicidation may be formed underneath the barrier layer.

Still referring to FIGS. 11A and 11B, in the present embodiment, the operation 26 also replaces the gate stack 116 with a final gate structure 126. It is noted that the S/D contact features 128 and the gate structure 126 may be fabricated in any order. In an embodiment, the operation 26 performs one or more etching processes to remove the gate stack 116 (including the HM layer 114, the HM layer 112, and the gate electrode layer 110), thereby forming a trench between the spacer layer 118. Subsequently, the operation 26 deposits the gate structure 126 into the trench. The gate structure 126 may include an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The metal fill layer may be formed by CVD, PVD, plating, and/or other suitable processes. In the embodiment shown in FIG. 11B, the oxide layer 108 is not removed and may serve as a gate dielectric layer. In an alternative embodiment, the oxide layer 108 is removed and replaced with a high-k gate dielectric layer such as hafnium oxide, zirconium oxide, lanthanum oxide, titanium oxide, yttrium oxide, and strontium titanate. The high-k gate dielectric layer may be formed by chemical oxidation, thermal oxidation, atomic layer deposition (ALD), chemical vapor deposition (CVD), and/or other suitable methods.

Figure 12:
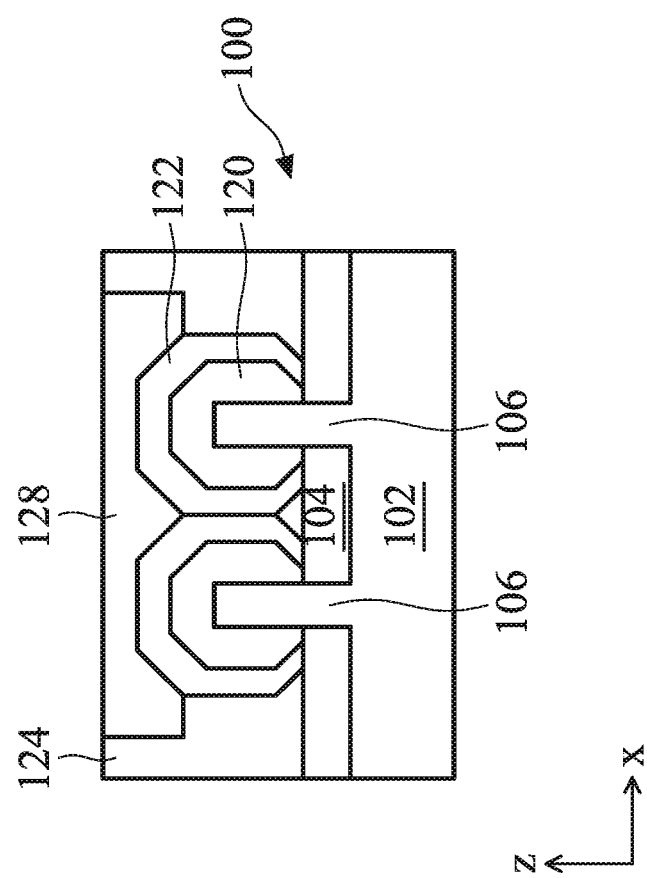
Figure 13:
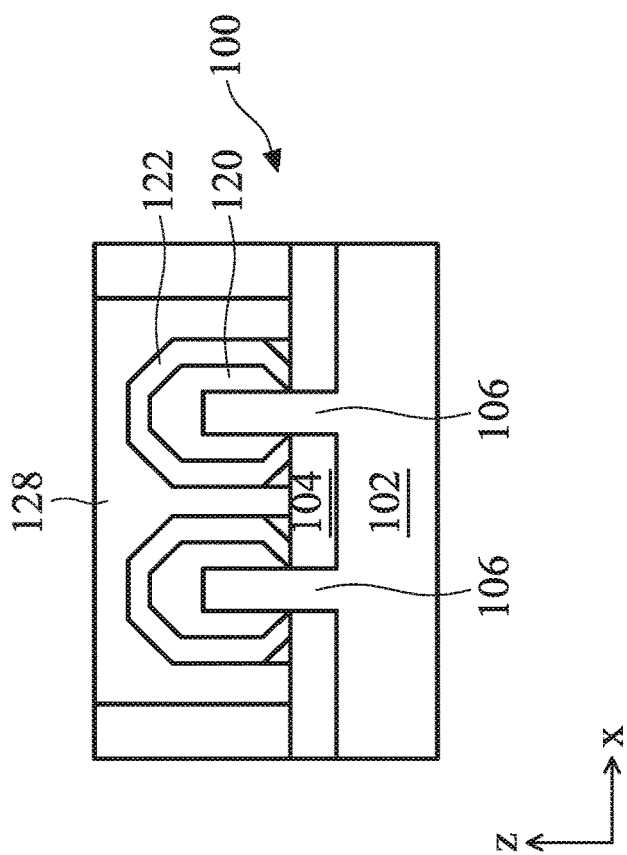
Figure 14:
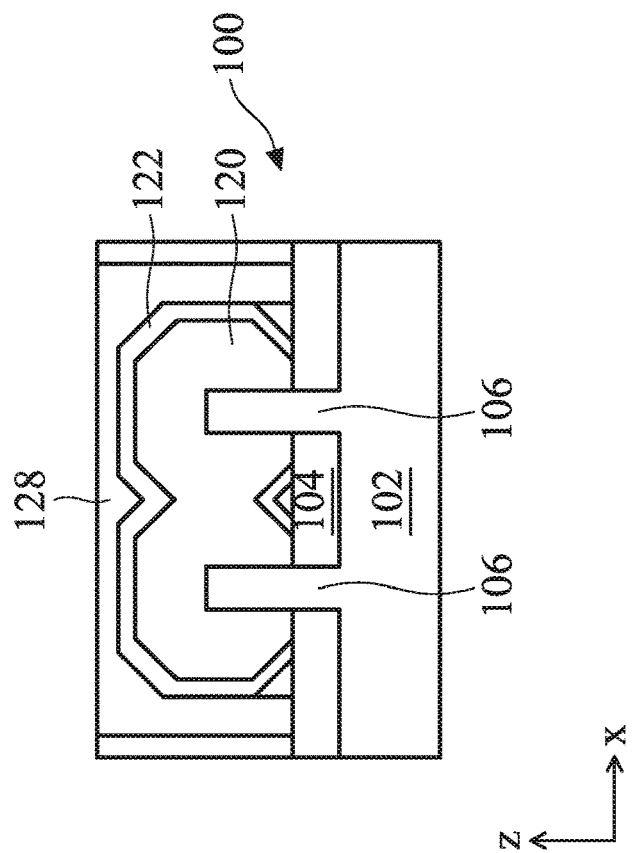

In the embodiment shown in FIG. 11A, the S/D contact feature 128 is deposited on top and sidewall surfaces of the epitaxial layer 122. In other words, the S/D contact feature 128 wraps around the epitaxial layer 122. This advantageously provides an increased contact area and a decreased contact resistance. FIG. 12 shows an alternative embodiment where the S/D contact feature 128 is deposited mostly on the top surfaces of the epitaxial layer 122. FIGS. 13 and 14 illustrate some alternative embodiments of the device 100. Referring to FIG. 13, the epitaxial layers 120 and 122 do not merge with the corresponding epitaxial features on the adjacent fins 106, and the S/D contact feature 128 wraps around each of the epitaxial layers 122. Referring to FIG. 14, the epitaxial layers 120 on the adjacent fins 106 merge, so do the epitaxial layer 122. The S/D contact feature 128 wraps around the merged epitaxial layers 122.

At operation 28, the method 10 (FIG. 1) may perform further processes to form a final device. For example, the method 10 may form one or more dielectric layers atop the dielectric layer 124, form S/D contact plugs (vias) and gate contact plugs (vias) over the S/D contact feature 128 and the gate structure 126 respectively, and form metal interconnects to connect terminals of various transistors to form an IC.

Figure 15:
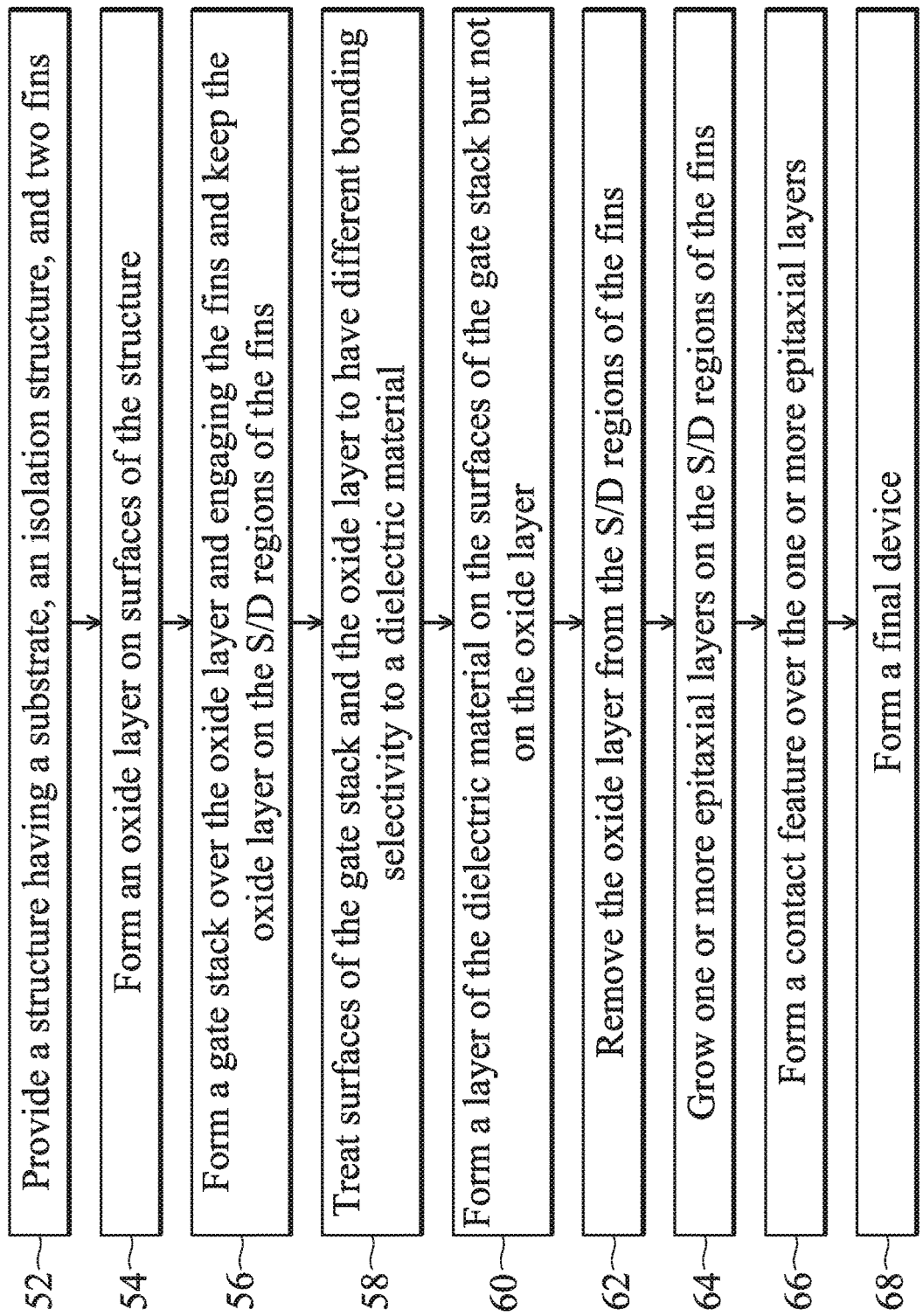
FIG. 15 is a flow chart of another method of forming a semiconductor device according to various aspects of the present disclosure.

FIG. 15 shows a flow chart of another method 50 of forming an embodiment of the semiconductor device 100, according to various aspects of the present disclosure. Some aspects of the method 50 are the same as the method 10, and will be briefly discussed below. Other aspects of the method 50 are different from the method 10, and will be described in more details.

At operation 52, the method 50 (FIG. 15) provides or is provided with a structure (the device 100) having the substrate 102, the isolation structure 104, and the two fins 106. This operation is the same as the operation 12 as discussed above with reference to FIGS. 1, 2A, 2B, and 2C.

At operation 54, the method 50 (FIG. 15) forms the oxide layer 108 on surfaces of the device 100. This operation is the same as the operation 14 as discussed above with reference to FIGS. 1, 3A, and 3B.

At operation 56, the method 50 (FIG. 15) forms the gate stack 116 over the oxide layer 108 and engaging the fins 106 in the respective channel region. Different from the operation 16 of the method 10, the operation 56 does not remove the oxide layer 108. Referring to FIGS. 16A and 16B, the oxide layer 108 remains on the top and sidewall surfaces of the fins 106 and on the top surface of the isolation structure 104. Other aspects of the operation 56 may be the same as those of the operation 16, including depositing blanket layers of the gate electrode layer 110, the HM layer 112, and the HM layer 114, and performing a photolithography process and one or more etching processes to form the gate stack 116.

At operation 58, the method 50 (FIG. 15) performs one or more surface treatment processes to the gate stack 116 and the oxide layer 108. The surface treatment processes are designed to make the surfaces of the gate stack 116 and the surfaces of the oxide layer 108 to have different bonding selectivity with respect to a dielectric material (e.g., silicon nitride). Particularly, after the treatment, it will be much easier for the dielectric material to be deposited over the surfaces of the gate stack 116 than over the surfaces of the oxide layer 108. In an embodiment, the gate electrode layer 110 comprises polysilicon, the HM layer 112 comprises a nitride, and the HM layer 114 comprises an oxide. To further this embodiment, the surface treatment processes are designed to make the surfaces of the gate electrode layer 110 and the HM layer 112 to be more bondable to the dielectric material than the surfaces of the oxide layer 108 and the HM layer 114.

In an embodiment, the surface treatment processes include applying a wet chemical (e.g., a cleaning solution) to the surfaces of the gate stack 116 and the oxide layer 108. For example, the wet chemical may include diluted hydrofluoric (DHF) acid, SPM ($H_2SO_4$:$H_2O_2$ mixture typically in 1:4), SC1 solution ($NH_4OH$:$H_2O_2$:$H_2O$ mixture typically in 1:1:5), SC2 (HCl:$H_2O_2$:$H_2O$ mixture typically in 1:1:5), and DIW (de-ionized water).

In an embodiment, the surface treatment processes include applying a dry chemical cleaning process (e.g., "Siconi" technology) to the surfaces of the gate stack 116 and the oxide layer 108.

In an embodiment, the surface treatment processes include applying an organic monolayer to the surfaces of the gate stack 116 and the oxide layer 108. For example, the organic monolayer may include $C_nH_{2n+1}SiCl_3$ or Poly(m-ethyl methacrylate) (PMMA). For example, PMMA may be spin coated on the surfaces of the gate stack 116 and the oxide layer 108 and is then diffused into the surfaces.

In an embodiment, the surface treatment processes include applying plasma to the surfaces of the gate stack 116 and the oxide layer 108. For example, the plasma may use $C_xF_y$, $C_xH_yF_z$, $CH_x$ (e.g., alkene, alkyne), or other suitable gases, with a gas flow rate of 5 to 100 sccm, and at a temperature from 10 to 300° C.

In an embodiment, the surface treatment processes include implanting one or more ion species into the surfaces of the gate stack 116 and the oxide layer 108. For example, the ion species may include one or more of arsenic ions, aluminum ions, boron ions, phosphorous ions, and other suitable ions.

At operation 60, the method 50 (FIG. 15) deposits a spacer layer 118. Referring to FIGS. 17A and 17B, in this embodiment, the gate electrode layer 110 comprises polysilicon, the HM layer 112 comprises a nitride, and the HM layer 114 comprises an oxide, therefore the spacer layer 118 is deposited onto the treated surfaces of the gate electrode layer 110 and the HM layer 112, but not (or insignificantly) onto the oxide layer 108 and the HM layer 114. In an embodiment, the spacer layer 118 comprises a nitride such as silicon nitride, silicon oxynitride, and silicon oxycarbide nitride. In an embodiment where the HM layer 112 comprises an oxide, the spacer layer 118 is not deposited onto the HM layer 112.

At operation 62, the method 50 (FIG. 15) removes the oxide layer 108 from the S/D regions 106a of the fins 106. Referring to FIGS. 18A and 18B, the oxide layer 108 is removed from the top and sidewall surfaces of the fins 106 and the top surface of the isolation structure 104 except under the gate stack 116 and the spacer layer 118. A portion of the oxide layer 108 remains under the gate stack 116 and the spacer layer 118. The operation 62 may use dry etching, wet etching, reactive ion etching, or other suitable etching processes. The etching process is tuned to selectively remove the oxide layer 108 without (or insignificantly) etching the fins 106, the isolation structure 104, the gate stack 116, and the spacer layer 118. The operation 62 may further perform a cleaning process to prepare the S/D regions 106a for subsequent epitaxial growth thereon.

Figure 19B:
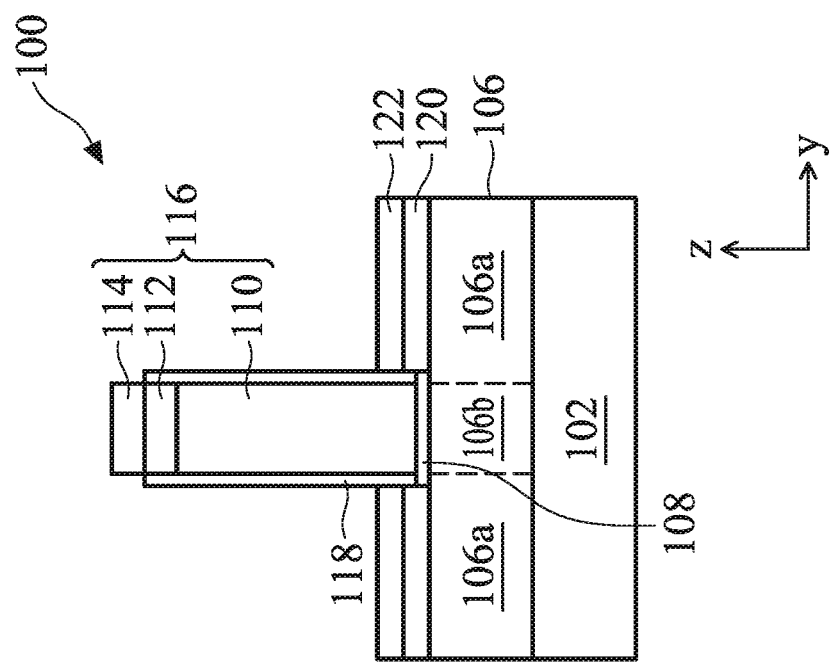
Figure 19A:
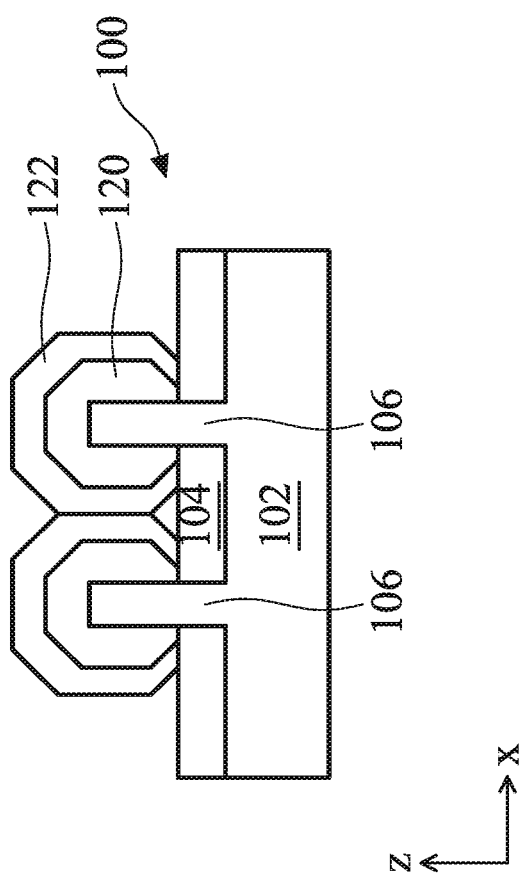

At operation 64, the method 50 (FIG. 15) grows one or more epitaxial layers on the S/D regions 106a. Referring to FIGS. 19A and 19B, the first epitaxial layer 120 is grown to wrap around the S/D regions 106a and the second epitaxial layer 122 is grown to wrap around the first epitaxial layer 120. The aspects of the operation 64 are the same as those of the operation 24 as discussed above with reference to FIGS. 1, 7A, 7B, 8, and 9.

Figure 20B:
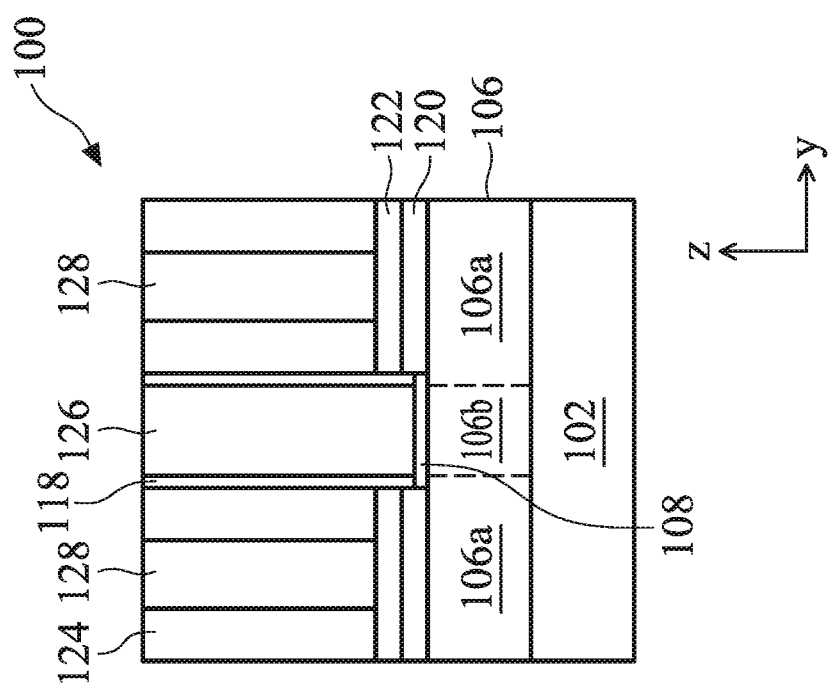
Figure 20A:
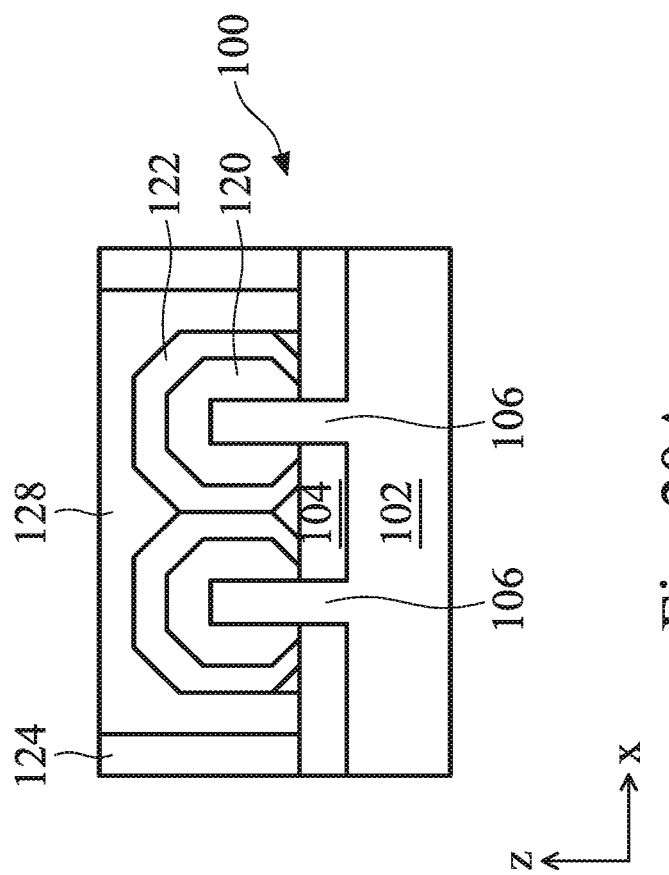

At operation 66, the method 50 (FIG. 15) forms contact features over the epitaxial layer 122. Referring to FIGS. 20A and 20B, the contact feature 128 is formed to wrap around the epitaxial layer 122, and the gate structure 126 replaces the gate stack 116. The aspects of the operation 66 are the same as those of the operation 26 as discussed above with reference to FIGS. 1, 10A, 10B, 11A, 11B, 12, 13, and 14.

Although not intended to be limiting, one or more embodiments of the present disclosure provide many benefits to a semiconductor device and a formation process thereof. For example, embodiments of the present disclosure provide methods of removing a spacer layer from S/D regions of fins without removing the spacer layer from sidewalls of a gate stack. These methods prepare the fins for growing epitaxial layers thereon. Further, the provided methods grow epitaxial layers on fins without recessing the fins, which advantageously maintains the strains built into channel regions of the fins. Still further, since the fins remain substantially intact during the S/D engineering processes, the epitaxial layers grown thereon are substantially uniform across a large area on a wafer.

In one exemplary aspect, the present disclosure is directed to a method of forming a semiconductor device. The method includes forming two fins extending from a substrate, each fin having two source/drain (S/D) regions and a channel region; forming a gate stack engaging each fin at the respective channel region; depositing one or more dielectric layers over top and sidewall surfaces of the gate stack and over top and sidewall surfaces of the S/D regions of the fins; and performing an etching process to the one or more dielectric layers, wherein the etching process simultaneously produces a polymer layer over the top surface of the gate stack, resulting in the top and sidewall surfaces of the S/D regions of the fins being exposed and a majority of the sidewall surfaces of the gate stack still being covered by the one or more dielectric layers. The method further includes growing one or more epitaxial layers over the top and sidewall surfaces of the S/D regions of the fins.

In an embodiment, the method further includes forming a contact feature in electrical contact with top and sidewall surfaces of the one or more epitaxial layers. In another embodiment, the method further includes, before the forming of the gate stack, forming an isolation structure over the substrate and between the two fins, wherein the gate stack is formed over the isolation structure.

In an embodiment of the method, the etching process is tuned to selectively remove the one or more dielectric layers over the S/D regions of the fins without substantially etching the fins.

In another embodiment of the method, the growing of the one or more epitaxial layers includes growing a first epitaxial layer in direct contact with the top and sidewall surfaces of each of the S/D regions of the fins; and after the first epitaxial layer on the two fins laterally merge, growing a second epitaxial layer in direct contact with the first epitaxial layer.

In another embodiment of the method, the growing of the one or more epitaxial layers includes growing a first epitaxial layer in direct contact with the top and sidewall surfaces of each of the S/D regions of the fins; and before the first epitaxial layer on the two fins laterally merge, growing a second epitaxial layer in direct contact with the first epitaxial layer. In a further embodiment, the second epitaxial layers on the two fins merge.

In another exemplary aspect, the present disclosure is directed to a method of forming a semiconductor device. The method includes providing a device structure having a substrate, an isolation structure over the substrate, and two fins extending from the substrate and through the isolation structure, each fin having two source/drain (S/D) regions and a channel region. The method further includes forming a gate stack over the isolation structure and over the fins, the gate stack engaging each fin at the respective channel region; and depositing one or more dielectric layers over top and sidewall surfaces of the gate stack and over top and sidewall surfaces of the S/D regions of the fins. The method further includes performing an etching process to the one or more dielectric layers, wherein a polymeric material is produced and deposited over the top surface of the gate stack during the etching process, the polymeric material protecting the one or more dielectric layers on the sidewall surface of the gate stack from the etching process, wherein the one or more dielectric layers on the top and sidewall surfaces of the S/D regions of the fins are removed by the etching process. The method further includes growing one or more epitaxial layers over the top and sidewall surfaces of the S/D regions of the fins.

In an embodiment of the method, the gate stack comprises polysilicon, the fins comprise silicon, and the one or more dielectric layers comprise a nitride. In a further embodiment, the etching process is anisotropic and is tuned to selectively remove the nitride but not silicon.

In another embodiment of the method, the fins and the one or more epitaxial layers comprise different semiconductor materials. In a further embodiment, the fins comprise silicon and the one or more epitaxial layers comprise silicon germanium.

In yet another embodiment of the method, the one or more epitaxial layers comprise a first epitaxial layer and a second epitaxial layer, and wherein the one or more epitaxial layers on the two fins merge into one epitaxial feature.

In an embodiment, the method further includes forming a contact feature over the one or more epitaxial layers.

In yet another exemplary aspect, the present disclosure is directed to a semiconductor device. The device includes a substrate; an isolation structure over the substrate; and two fins extending from the substrate and through the isolation structure, wherein each fin includes two source/drain (S/D) regions and a channel region. The device further includes a gate stack engaging each fin at the respective channel region; a first epitaxial layer over top and sidewall surfaces of the S/D regions of the fins, wherein the first epitaxial layer on the two fins laterally merge; and a second epitaxial layer over top and sidewall surfaces of the first epitaxial layer.

In an embodiment, the device further includes a dielectric layer on sidewalls of the gate stack; and an oxide layer under the dielectric layer and over the isolation structure. In a further embodiment, the oxide layer also extends under the gate stack. In an alternative embodiment, the oxide layer is disposed between the gate stack and the respective channel region of the fins.

In another embodiment, the device further includes a contact feature disposed over the second epitaxial layer. In a further embodiment, the contact feature is disposed over at least a top surface and a side surface of the second epitaxial layer.

In one exemplary aspect, the present disclosure is directed to a method of forming a semiconductor device. The method includes providing a device structure having a substrate, an isolation structure over the substrate, and two fins extending from the substrate and through the isolation structure, each fin having two source/drain (S/D) regions and a channel region the method further includes depositing a first dielectric layer over top and sidewall surfaces of the fins and over the isolation structure; forming a gate stack over the first dielectric layer and engaging each fin at the respective channel region; and treating surfaces of the gate stack and the first dielectric layer such that, when a second dielectric layer is deposited, it is more selective to the surfaces of the gate stack than the surfaces of the first dielectric layer. The method further includes, after the step of treating, depositing the second dielectric layer. The method further includes etching the first dielectric layer to expose the S/D regions of the fins.

In an embodiment, the method further includes growing one or more epitaxial layers over the top and sidewall surfaces of the S/D regions of the fins.

In an embodiment of the method, a portion of the first dielectric layer remains under the gate stack and the second dielectric layer. In another embodiment of the method, the gate stack comprises polysilicon, the first dielectric layer comprises an oxide, and the second dielectric layer comprises silicon and nitrogen.

In another exemplary aspect, the present disclosure is directed to a method of forming a semiconductor device. The method includes providing a device structure having a substrate, an isolation structure over the substrate, and two fins extending from the substrate and through the isolation structure, wherein each fin includes two source/drain (S/D) regions and a channel region. The method further includes depositing a first dielectric layer over top and sidewall surfaces of the fins and over the isolation structure; forming a gate stack over the first dielectric layer and engaging each fin at the respective channel region; and performing a selective spacer deposition process, wherein the selective spacer deposition process forms a second dielectric layer over sidewall surfaces of the gate stack but not over the S/D regions of the fins. The method further includes etching the first dielectric layer to expose the S/D regions of the fins.

In an embodiment, before the performing of the selective spacer deposition process, the method further includes performing a surface treatment process to the gate stack and the first dielectric layer such that it is easier for the second dielectric layer to join the sidewall surfaces of the gate stack than to join surfaces of the first dielectric layer. In an embodiment, the surface treatment process includes treating the gate stack and the first dielectric layer with a wet chemical. In an alternative embodiment, the surface treatment process includes implanting one or more ion species into the sidewall surfaces of the gate stack and the surfaces of the first dielectric layer. In yet another embodiment, the surface treatment process includes a plasma treatment process. In another embodiment, the surface treatment process includes treating the sidewall surfaces of the gate stack and the surfaces of the first dielectric layer with an organic material.

In yet another exemplary aspect, the present disclosure is directed to a method of forming a semiconductor device. The method includes providing a device structure having a substrate, an isolation structure over the substrate, two fins extending from the substrate and through the isolation structure, and a gate stack, wherein each fin includes two source/drain (S/D) regions and a channel region, and the gate stack engages each fin at the respective channel region the method further includes depositing one or more dielectric layers over top and sidewall surfaces of the gate stack and over top and sidewall surfaces of the S/D regions of the fins; and depositing a polymeric material over the one or more dielectric layers, wherein the polymeric material is deposited thicker over the top surface of the gate stack than over the top surface of the S/D regions of the fins. The method further includes performing an etching process to the device structure, thereby removing the one or more dielectric layers from the top and sidewall surfaces of the S/D regions of the fins. The method further includes growing one or more epitaxial layers over the top and sidewall surfaces of the S/D regions of the fins.

In an embodiment of the method, the gate stack comprises polysilicon, the fins comprise silicon, and the one or more dielectric layers comprise a nitride. In a further embodiment, the etching process is tuned to selectively remove the nitride but not silicon.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   an isolation feature disposed on the substrate;
   first and second fins protruding from the substrate and upwardly through the isolation feature, wherein each fin includes two source/drain (S/D) regions and a channel region, and each fin includes a top surface that remains flat across the S/D regions and the channel region;
   a gate stack engaging each fin at the respective channel region;
   a first dielectric layer on sidewalls of the gate stack;
   a first epitaxial layer having a first portion over top and sidewall surfaces of the S/D regions of the first fin and a second portion over top and sidewall surfaces of the S/D regions of the second fin, wherein the first and second portions of the first epitaxial layer are spaced apart;
   a second epitaxial layer having a first portion over top and sidewall surfaces of the first portion of the first epitaxial layer and a second portion over top and sidewall surfaces of the second portion of the first epitaxial layer, wherein the first and second portions of the second epitaxial layer are spaced apart, wherein the second epitaxial layer includes silicon germanium, wherein the second epitaxial layer is in physical contact with the isolation feature;
   a contact feature disposed over the second epitaxial layer; and
   a germano-silicide layer disposed vertically between the contact feature and the second epitaxial layer.

2. The semiconductor device of claim 1, where the gate stack is a metal gate stack, further comprising:
   a second dielectric layer disposed above the channel regions of the first and second fins, wherein the second dielectric layer is directly under both the first dielectric layer and the gate stack.

3. The semiconductor device of claim 2, wherein the first dielectric layer comprises a nitride, and the second dielectric layer comprises an oxide.

4. The semiconductor device of claim 2, wherein the second dielectric layer is in physical contact with the first epitaxial layer.

5. The semiconductor device of claim 1, wherein a portion of the second epitaxial layer is laterally stacked between the first and second fins.

6. The semiconductor device of claim 1, wherein the contact feature is disposed over at least a top surface and a side surface of the second epitaxial layer.

7. The semiconductor device of claim 1, wherein a portion of the contact feature between the first and second fins extends under the top surface of each of the first and second fins.

8. The semiconductor device of claim 1, further comprising:
   a third dielectric layer in physical contact with sidewalls of the contact feature, wherein the third dielectric layer is spaced apart from the second epitaxial layer.

9. The semiconductor device of claim 1, wherein the first epitaxial layer also includes silicon germanium.

10. A semiconductor device comprising:
    a substrate;
    an isolation structure over the substrate;
    first and second fins extending from the substrate and through the isolation structure, wherein each fin includes two source/drain (S/D) regions and a channel region;
    a gate stack engaging each fin at the respective channel region;
    a first epitaxial layer over top and sidewall surfaces of the S/D regions of the first and second fins, wherein portions of the first epitaxial layer over the first and second fins laterally merge;
    a second epitaxial layer over top and sidewall surfaces of the first epitaxial layer, wherein a portion of the second epitaxial layer is below a bottom surface of the first epitaxial layer between the first and second fins;
    a contact feature disposed over the second epitaxial layer; and
    a silicide feature disposed between the contact feature and the second epitaxial layer.

11. The semiconductor device of claim 10, wherein the second epitaxial layer extends continuously from a position above the first fin to a position above the second fin.

12. The semiconductor device of claim 10, wherein the first epitaxial layer is divided by the second epitaxial layer into a first portion wrapping the first fin and a second portion wrapping the second fin.

13. The semiconductor device of claim 10, further comprising:
a dielectric layer below the bottom surface of the first epitaxial layer and above the isolation structure.

14. The semiconductor device of claim 10, wherein each fin has a substantially flat top surface extending from the respective S/D regions to the channel region.

15. The semiconductor device of claim 10, wherein the contact feature is disposed over top and sidewall surfaces of the second epitaxial layer.

16. The semiconductor device of claim 10, wherein the contact feature is in physical contact with the isolation structure.

17. A semiconductor device comprising:
a substrate;
an isolation structure over the substrate;
a fin extending from the substrate and through the isolation structure;
a metal gate stack over a channel region of the fin;
a first epitaxial layer over top and sidewall surfaces of a source/drain (S/D) region of the fin;
an oxide layer directly under the metal gate stack, wherein the first epitaxial layer physically contacts the oxide layer;
a second epitaxial layer over top and sidewall surfaces of the first epitaxial layer;
a conductive feature over top and sidewall surfaces of the second epitaxial layer, wherein the conductive feature physically contacts the isolation structure; and
a silicide feature interposing the conductive feature and the second epitaxial layer.

18. The semiconductor device of claim 17, wherein a top surface of the fin in the channel region and the S/D region is substantially flat.

19. The semiconductor device of claim 17, wherein the second epitaxial layer includes germanium, and the silicide feature is a germano-silicide feature.

20. The semiconductor device of claim 17, wherein a top surface of the first epitaxial layer is above a top surface of the oxide layer.

* * * * *